(12) United States Patent
Zang et al.

(10) Patent No.: US 9,443,944 B2
(45) Date of Patent: Sep. 13, 2016

(54) INTEGRATED CIRCUITS WITH MIDDLE OF LINE CAPACITANCE REDUCTION IN SELF-ALIGNED CONTACT PROCESS FLOW AND FABRICATION METHODS

(71) Applicants: GLOBALFOUNDRIES Inc., Grand Cayman (KY); INTERNATIONAL BUSINESS MACHINES CORPORATION, Armonk, NY (US)

(72) Inventors: Hui Zang, Guilderland, NY (US); Balasubramanian Pranatharthiharan, Watervliet, NY (US)

(73) Assignees: GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 25 days.

(21) Appl. No.: 14/541,754

(22) Filed: Nov. 14, 2014

(65) Prior Publication Data

US 2016/0141379 A1 May 19, 2016

(51) Int. Cl.
*H01L 29/417* (2006.01)
*H01L 29/40* (2006.01)
*H01L 21/28* (2006.01)

(52) U.S. Cl.
CPC ... *H01L 29/41783* (2013.01); *H01L 21/28008* (2013.01); *H01L 29/401* (2013.01)

(58) Field of Classification Search
CPC .......... H01L 29/41783; H01L 21/02112; H01L 21/28008; H01L 21/41783
USPC .......................................................... 257/386
See application file for complete search history.

(56) References Cited

U.S. PATENT DOCUMENTS

| 2014/0327080 A1* | 11/2014 | Hung | H01L 29/66515 |
| | | | 257/365 |
| 2015/0364592 A1* | 12/2015 | van Dal | H01L 29/785 |
| | | | 257/29 |

* cited by examiner

*Primary Examiner* — Kenneth Parker
*Assistant Examiner* — Warren H Kilpatrick
(74) *Attorney, Agent, or Firm* — Heslin Rothenberg Farley & Mesiti P.C.; Jacquelyn A. Graff

(57) ABSTRACT

Devices and methods for forming semiconductor devices with middle of line capacitance reduction in self-aligned contact process flow and fabrication are provided. One method includes, for instance: obtaining a wafer with at least one source, drain, and gate; forming a first contact region over the at least one source and a second contact region over the at least one drain; and forming at least one first and second small contact over the first and second contact regions. One intermediate semiconductor device includes, for instance: a wafer with a gate, source region, and drain region; at least one first contact region positioned over a portion of the source; at least one second contact region positioned over a portion of the drain; at least one first small contact positioned above the first contact region; and at least one second small contact positioned above the second contact region.

20 Claims, 38 Drawing Sheets

US 9,443,944 B2

INTEGRATED CIRCUITS WITH MIDDLE OF LINE CAPACITANCE REDUCTION IN SELF-ALIGNED CONTACT PROCESS FLOW AND FABRICATION METHODS

FIELD OF THE INVENTION

The present invention relates to semiconductor devices and methods of fabricating semiconductor devices, and more particularly, to integrated circuits with middle of line capacitance reduction in self-aligned contact process flow and fabrication methods.

BACKGROUND OF THE INVENTION

As semiconductor devices continue to decrease in size, FinFET parasitic gate to contact capacitance continues to increase due to the scaling of gate pitch. In addition, as FinFET devices continue to shrink, more gate to contact shorts are experienced. The gate to contact shorts are a major yield killer for smaller FinFET devices. Thus, a reduction in both gate to contact capacitance and a reduction in gate to contact short failure are needed.

SUMMARY OF THE INVENTION

The shortcomings of the prior art are overcome and additional advantages are provided through the provision, in one aspect, a method includes obtaining a wafer with at least one source, at least one drain, and at least one gate; forming a first contact region over at least a portion of the at least one source; forming a second contact region over at least a portion of the at least one drain; forming at least one first small contact over the first contact region; and forming at least one second small contact over the second contact region.

In another aspect, a device is provided which includes, for instance: a wafer with at least one gate, at least one source region, and at least one drain region; at least one first contact region positioned over at least a portion of the at least one source region; at least one second contact region positioned over at least a portion of the at least one drain region; at least one first small contact positioned above the at least one first contact region; and at least one second small contact positioned above the at least one second contact region Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with a reduction in both gate to contact capacitance and a reduction in gate to contact short failure.

Figure 1:
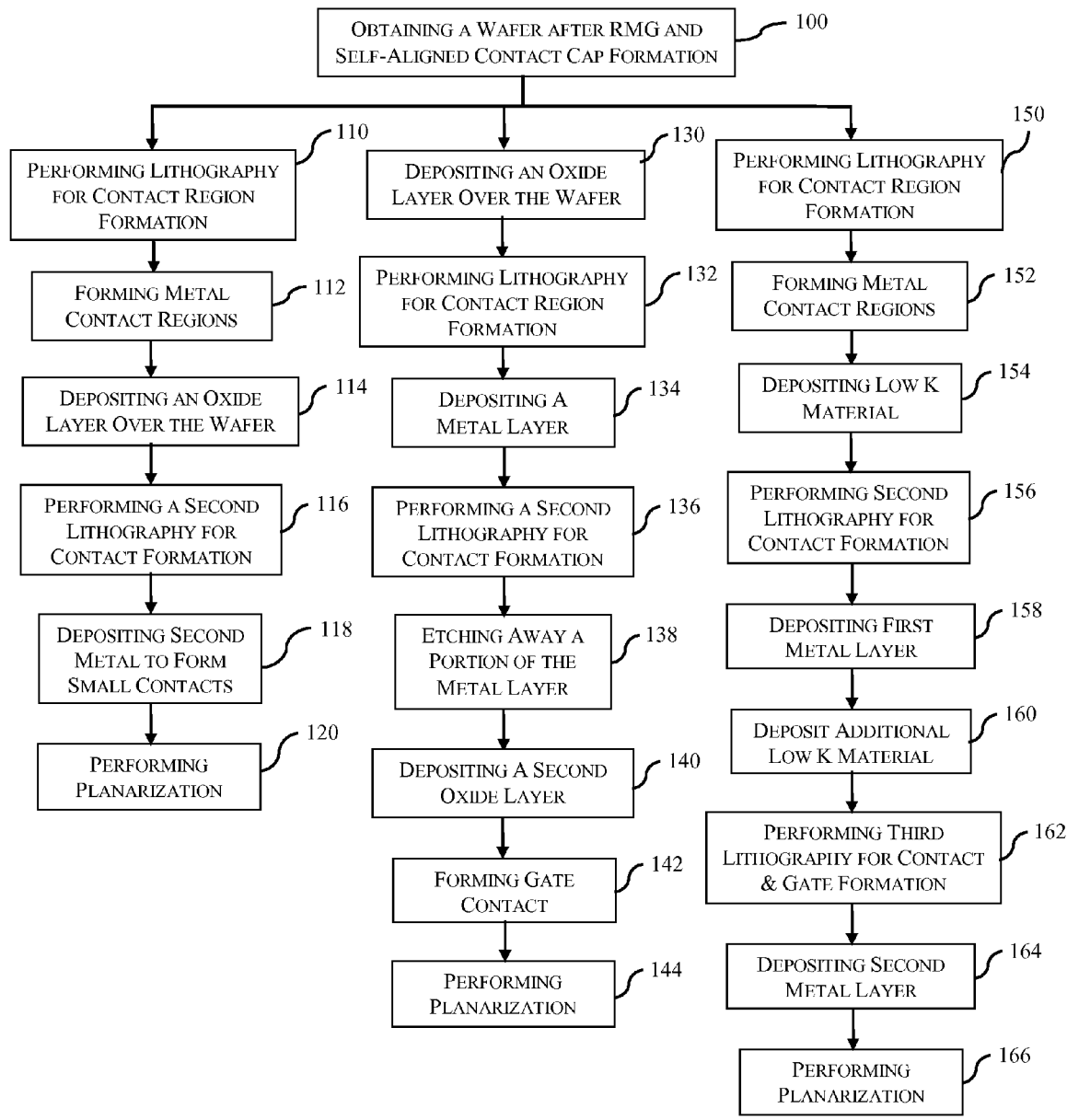
FIG. 1 depicts one embodiment of a method for forming an integrated circuit with self-aligned contacts, in accordance with one or more aspects of the present invention.

In one aspect, in one embodiment, as shown in FIG. 1, semiconductor device formation process in accordance with one or more aspects of the present invention may include, for instance: obtaining a wafer after replacement metal gate (RMG) and self-aligned contact (SAC) cap formation 100; performing lithography for contact region formation 110; forming the metal contact regions 112; depositing an oxide layer over the wafer 114; performing a second lithography for contact formation 116; depositing a second metal to form small contacts 118; and performing chemical mechanical planarization (CMP) to remove the excess second metal 120.

In another embodiment, the semiconductor device formation process in accordance with one or more aspects of the present invention may include, for instance: obtaining a wafer after replacement metal gate (RMG) and self-aligned contact (SAC) cap formation 100; depositing a first oxide layer over the wafer 130; performing lithography for contact region formation 132; depositing a metal layer 134; performing a second lithography for contact formation 136; partial etching the metal layer 138; depositing a second oxide layer over the wafer 140; forming the gate contacts 142; and performing planarization to remove the excess gate metal 144.

In yet another embodiment, the semiconductor device formation process in accordance with one or more aspects of the present invention may include, for instance: obtaining a wafer after replacement metal gate (RMG) and self-aligned contact (SAC) cap formation 100; performing lithography for contact region formation 150; forming metal contact regions 152; depositing low k material over the wafer 154; performing second lithography for contact formation 156; depositing first metal layer 158; depositing additional low k material 160; performing a third lithography for contact and gate formation 162; depositing a second metal layer over the wafer to form second part of small contacts and the gate contacts 164; and performing planarization to remove the excess second metal 166.

FIGS. 2-44 depict, by way of example only, several detailed embodiments of a portion of a FinFET device formation process of FIG. 1 and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 2:
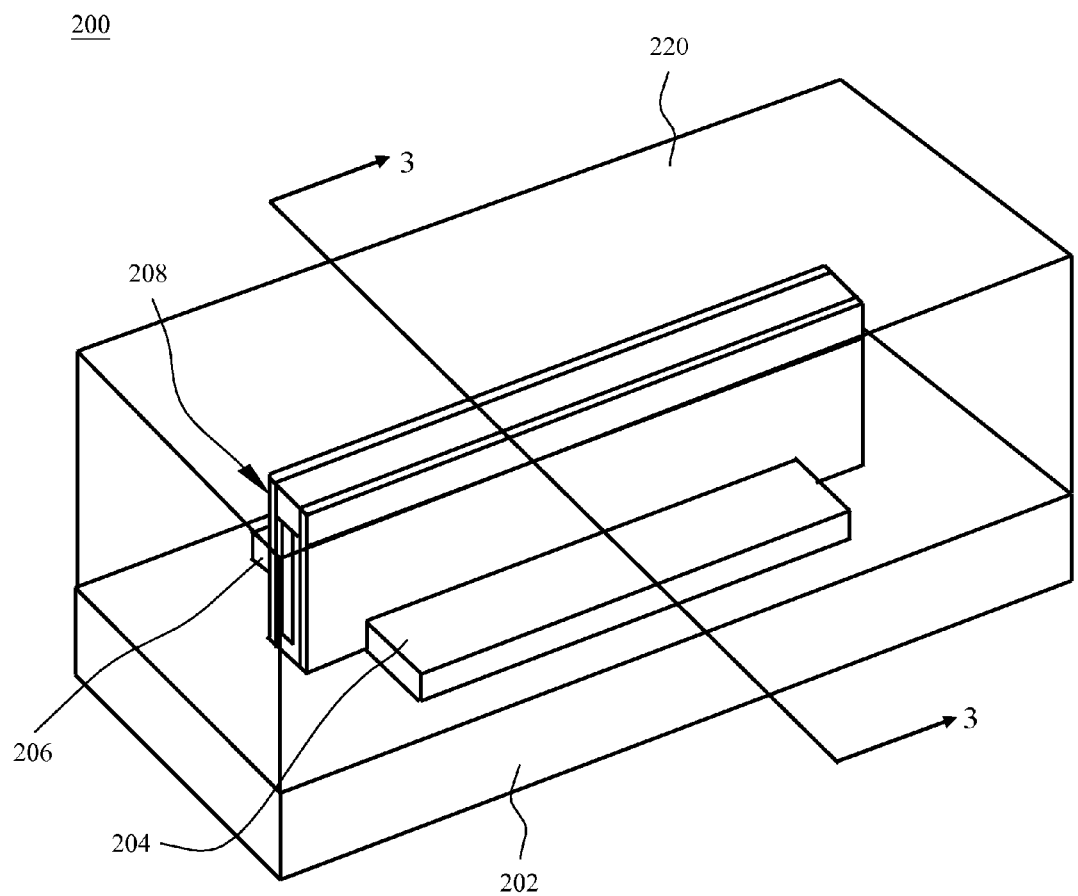
FIG. 2 depicts a perspective view of a portion of a semiconductor device with at least one gate, a source, and a drain, in accordance with one or more aspects of the present invention.

FIGS. 2-18 depict, by way of example only, one detailed embodiment of a portion of the FinFET device formation process of FIG. 1. A portion of a semiconductor device 200 obtained during the fabrication process is shown in FIG. 2. The device 200 may have been processed through initial device processing steps in accordance with the design of the device 200 being fabricated, for example, the device 200 may include, for example, an isolation region 202, at least one source region 204, at least one drain region 206, and at least one gate 208. It is also contemplated that additional features may be present on the device 200. The at least one source region 204, at least one drain region 206, and at least one gate 208 are shown positioned over the isolation region 202 for ease of illustration. The at least one source region 204 and at least one drain region 206 may be, for example, embedded silicon germanium (eSiGe) for pFETs or embedded silicon phosphorus (eSiP) for nFETs. The at least one gate 208 may be positioned over one or more fins (not shown). The at least one gate 208 may include, for example, at least one work function metal 210 and a gate metal 212. At least one self-aligned contact (SAC) cap 214 may be positioned over the at least one gate 208. The SAC cap 214 may be, for example, silicon nitride (SiN) or another insulating material. The at least one gate 208 may also include a spacer 216 positioned on each side of the at least one gate 208 and SAC cap 214. The at least one source region 204 and at least one drain region 206 may be, for example, positioned adjacent to the at least one gate 208.

Figure 3:
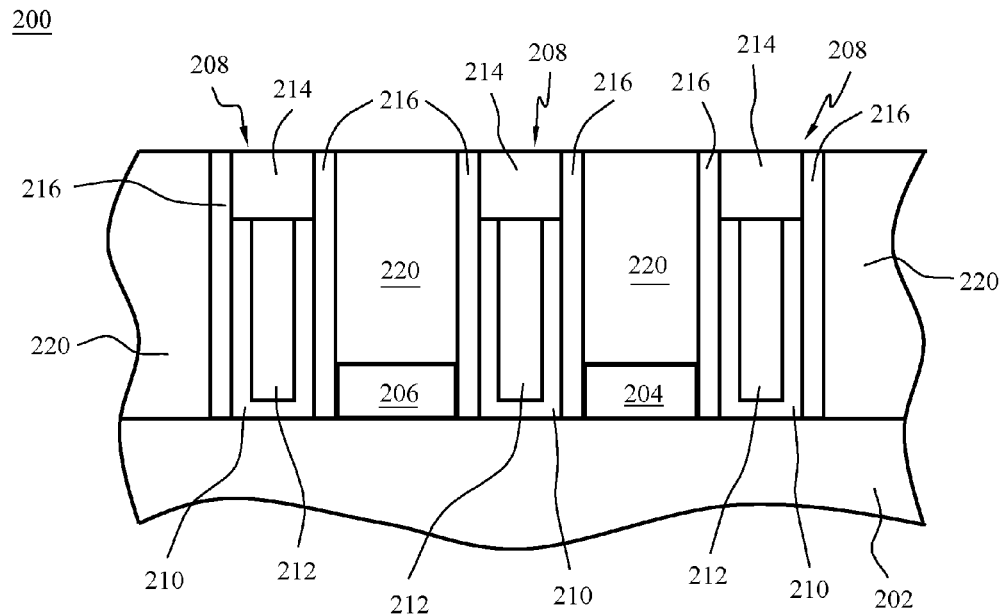
FIG. 3 depicts a cross-sectional elevation view of the semiconductor device of FIG. 2 taken along line 3-3, in accordance with one or more aspects of the present invention.
Figure 4:
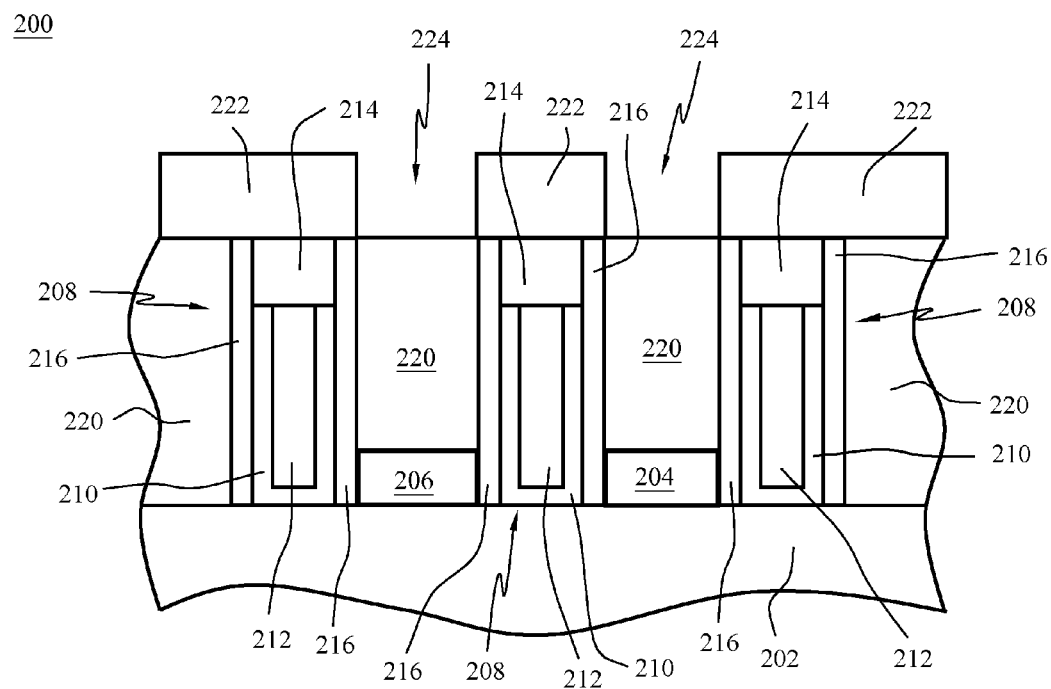
FIG. 4 depicts the structure of FIG. 3 after applying and patterning a photo resist layer, in accordance with one or more aspects of the present invention.
Figure 5:
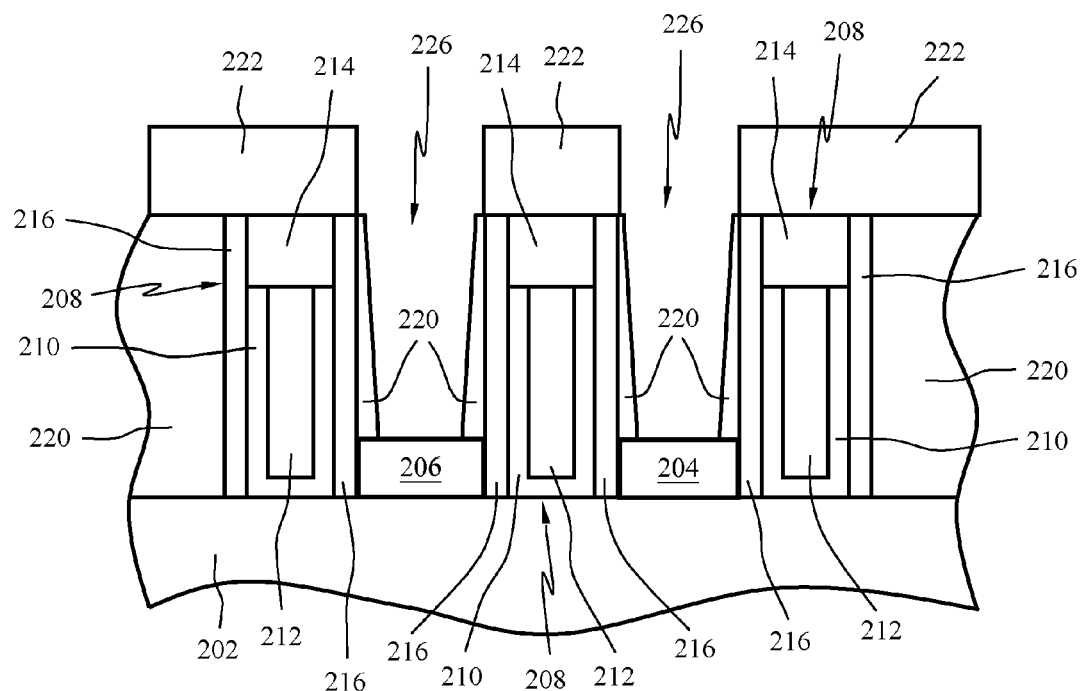
FIG. 5 depicts the structure of FIG. 4 after etching the oxide layer, in accordance with one or more aspects of the present invention.

As shown in FIGS. 2 and 3, the device 200 may also include an oxide layer 220 deposited over the device 200 and planarized leaving the oxide layer 220 surrounding or positioned between the at least one gate 208. The oxide layer 220 may be planarized down to the top of the SAC cap 214 by, for example, chemical mechanical planarization. The at least one gate 208 may be spaced apart from the oxide layer 220 by the spacers 216. As depicted in FIG. 4, a photo resist layer 222 may be deposited over the device 200. Then the photo resist layer 222 may be patterned to form openings 224 in the photo resist layer 222. Next, as shown in FIG. 5, the device 200 may be etched to remove the portion of the oxide layer 220 not covered by the photo resist layer 222 to form cavities 226 between the gates 208. The etching of the oxide layer 220 may be, for example, a dry etch or a wet etch. The device 200 may be etched down to the top of the at least one source region 204 and at least one drain region 206. The cavities 226 may be positioned over the at least one source region 204 and at least one drain region 206 and a portion of the oxide layer, shown as regions 218 in FIG. 10.

It is also contemplated that two etches may be performed, when forming cavities 226. The first etch may be performed to form regions 218 that extend out from the at least one source region 204 and at least one drain region 206 past the at least one gate 208 which may be filled with a first metal material. Then, after a partial recess etch is performed down to the top of the at least one source region 204 and at least one drain region 206 to form regions 218, a second etch may be performed to form the cavities 226 over the regions 218 and the at least one source region 204 and at least one drain region 206.

Figure 6:
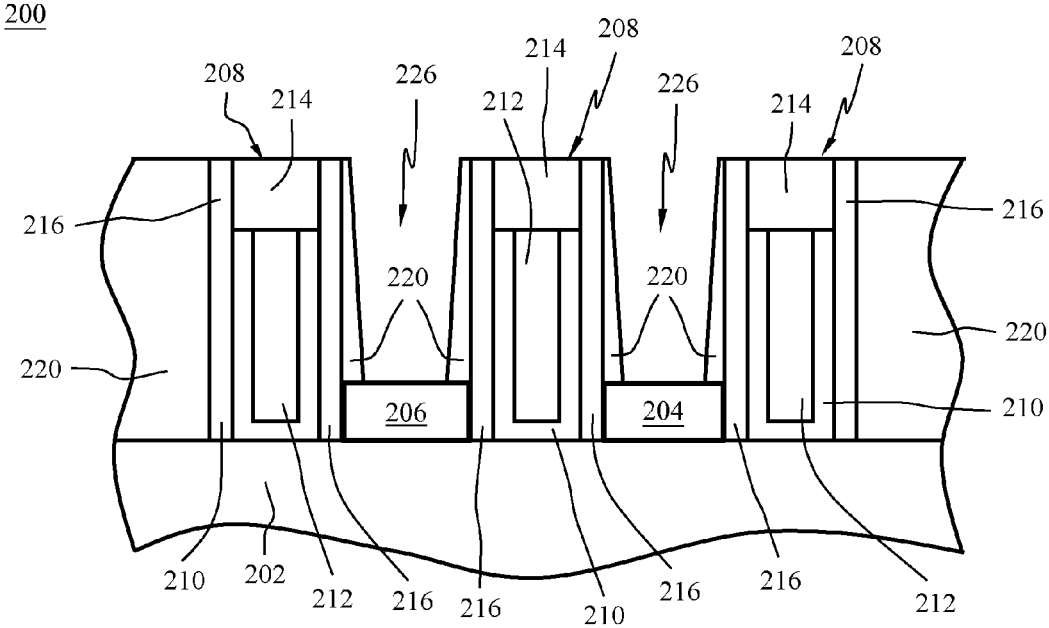
FIG. 6 depicts the structure of FIG. 5 after removing the photo resist layer, in accordance with one or more aspects of the present invention.
Figure 7:
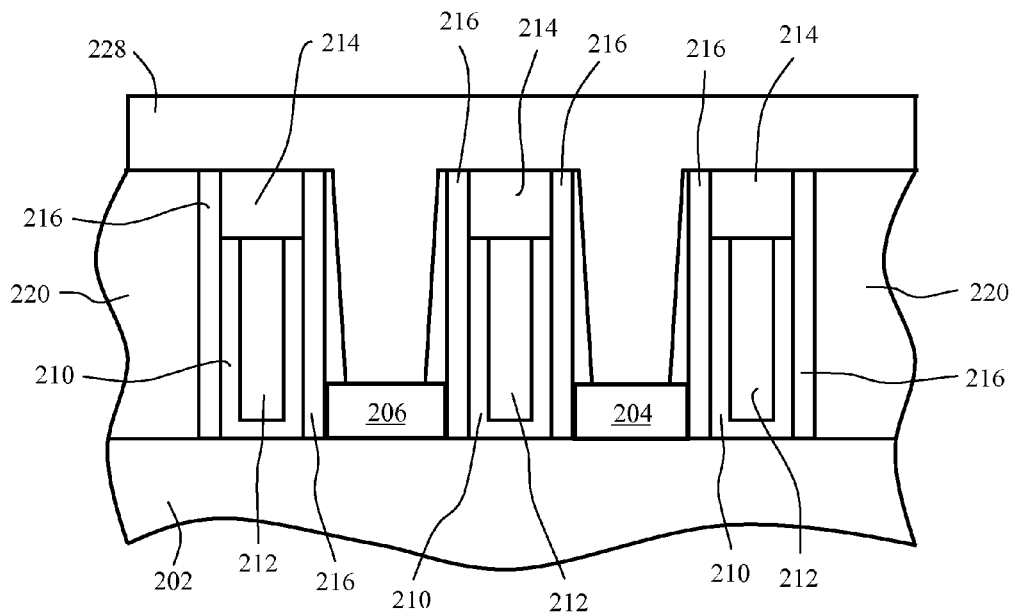
FIG. 7 depicts the structure of FIG. 6 after depositing a metal layer, in accordance with one or more aspects of the present invention.
Figure 8:
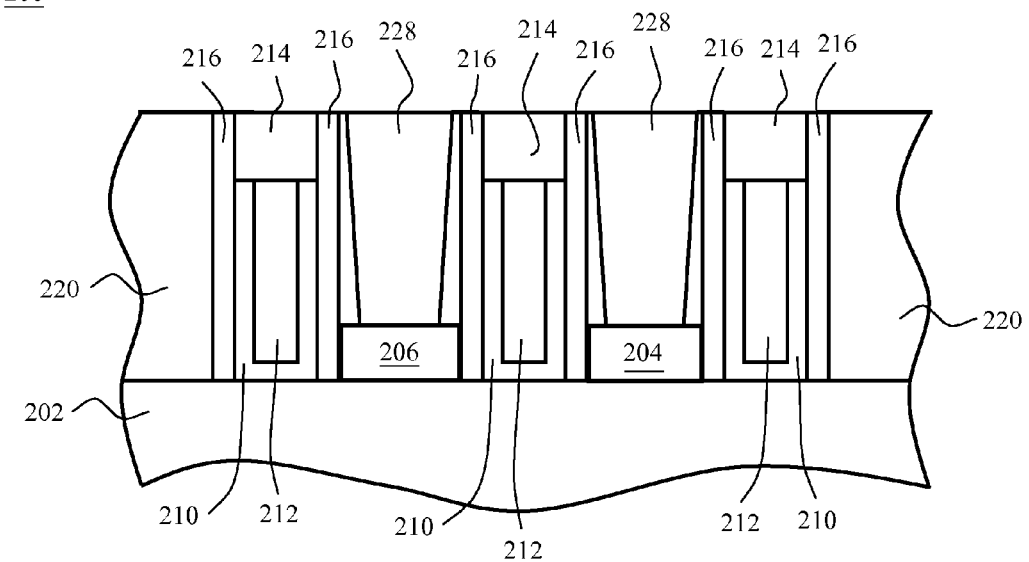
FIG. 8 depicts the structure of FIG. 7 after performing planarization on the device, in accordance with one or more aspects of the present invention.
Figure 9:
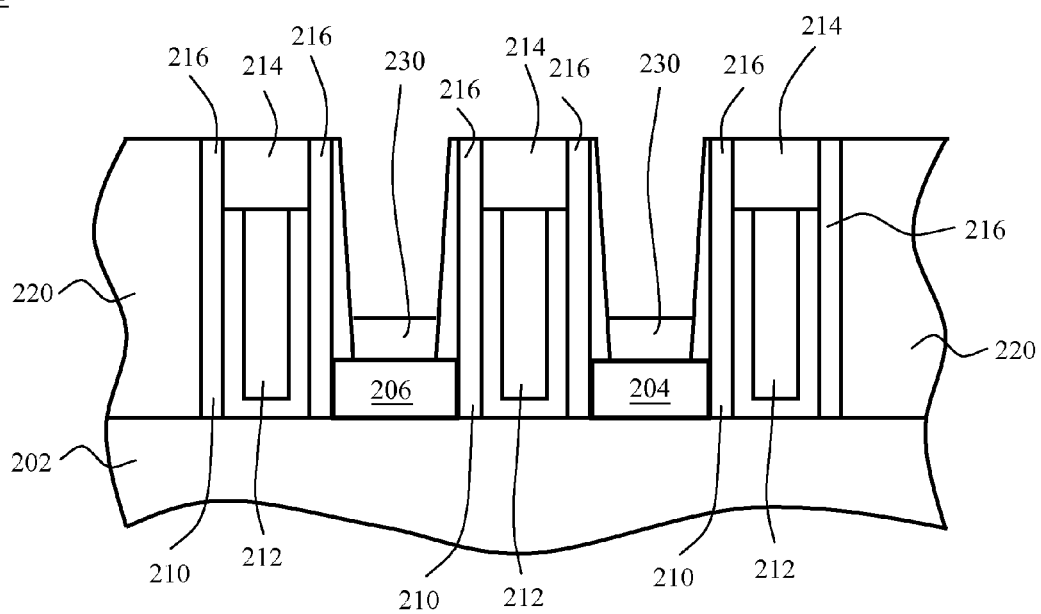
FIG. 9 depicts the structure of FIG. 8 after partial recess etching into the metal layer to form a contact region, in accordance with one or more aspects of the present invention.
Figure 10:
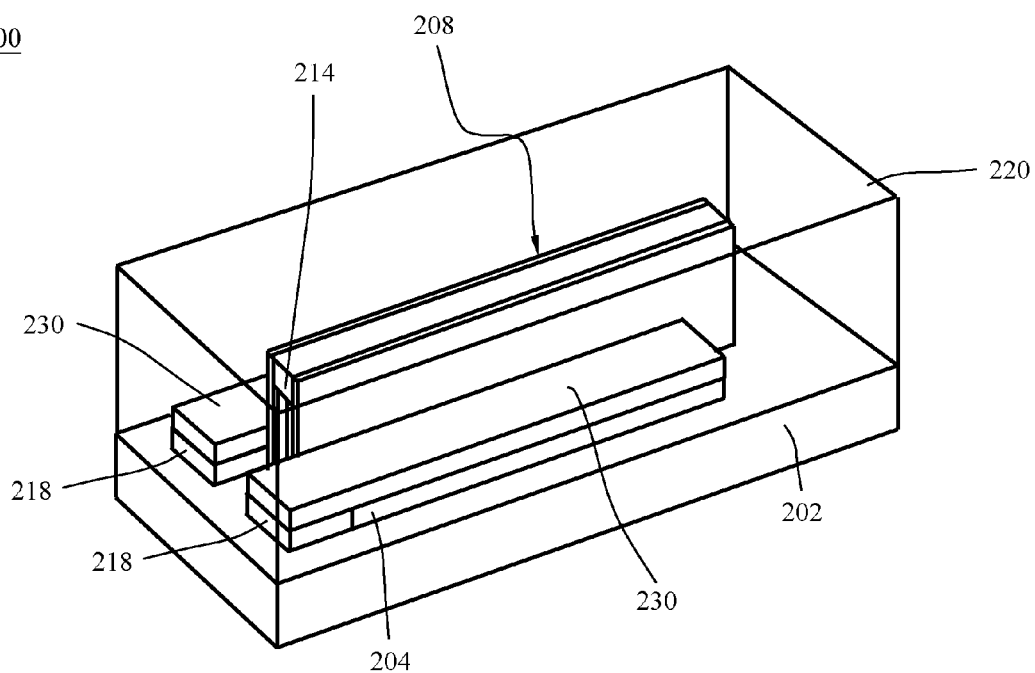
FIG. 10 depicts a perspective view of the structure of FIG. 9, in accordance with one or more aspects of the present invention.
Figure 11:
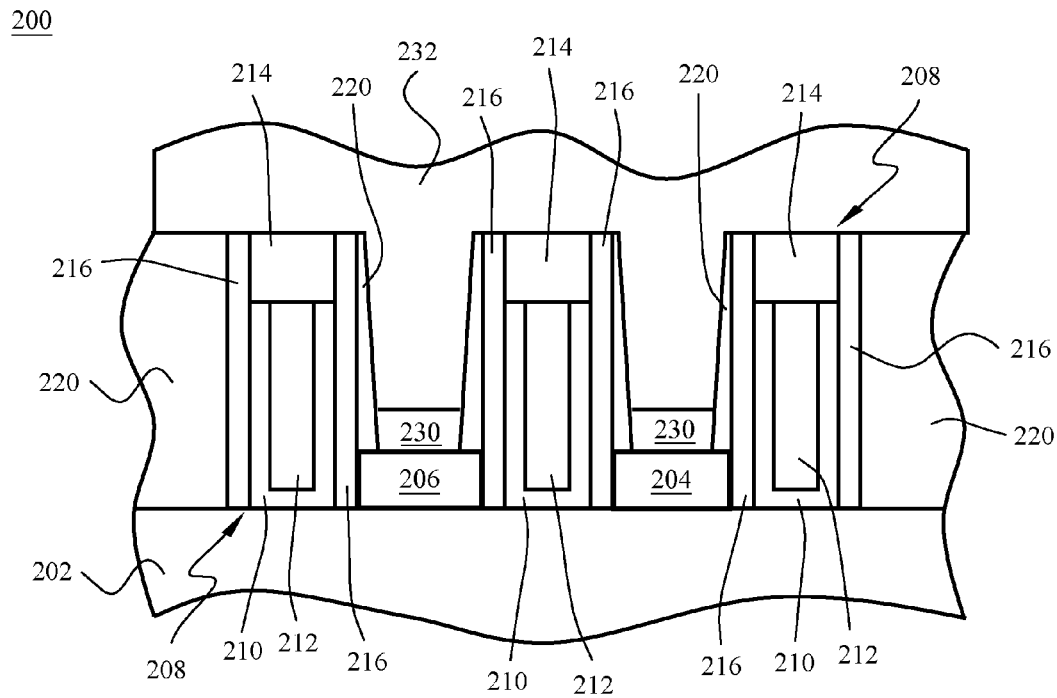
FIG. 11 depicts the structure of FIG. 9 after depositing an oxide layer on the device, in accordance with one or more aspects of the present invention.
Figure 12:
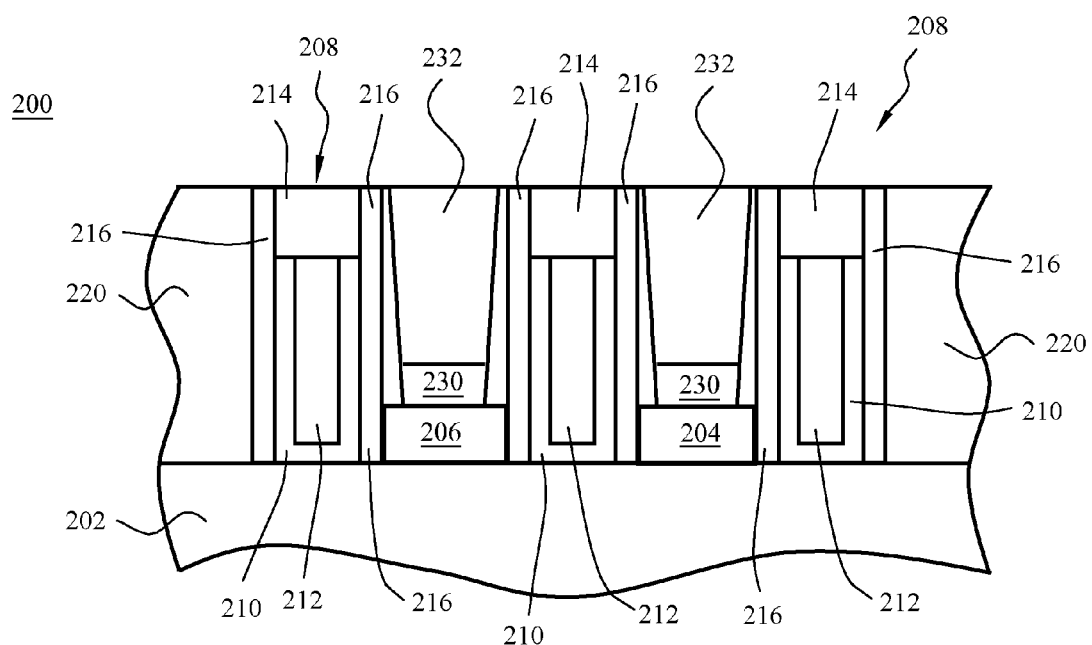
FIG. 12 depicts the structure of FIG. 11 after performing planarization, in accordance with one or more aspects of the present invention.

After the device 200 is etched the photo resist layer 222 may be removed, as shown in FIG. 6. Next, a metal layer 228 may be deposited over the device 200 to fill the cavities 226, as shown in FIG. 7. The metal layer 228 may be the same or a different metal as the first metal material that may be used to fill regions 218, if the device 200 design includes filling regions 218 with a metal. Then, the device 200 may be planarized by, for example, chemical mechanical planarization, as shown in FIG. 8. The planarization may be, for example, down to the top of the SAC cap 214. Next, as shown in FIGS. 9 and 10, a partial recess etch of the metal layer 228 may be performed to form contact regions 230 positioned over the region 218 and the at least one source region 204 and at least one drain region 206. As shown in FIG. 11, a second oxide layer 232 may then be deposited over the device 200. The device 200 may then be planarized by, for example, chemical mechanical planarization, down to the top of the at least one SAC cap 214, as shown in FIG. 12.

After the device 200 is planarized the second oxide layer 232 will be positioned over the contact regions 230 between the gates 208 and over the entire device 200.

Figure 13:
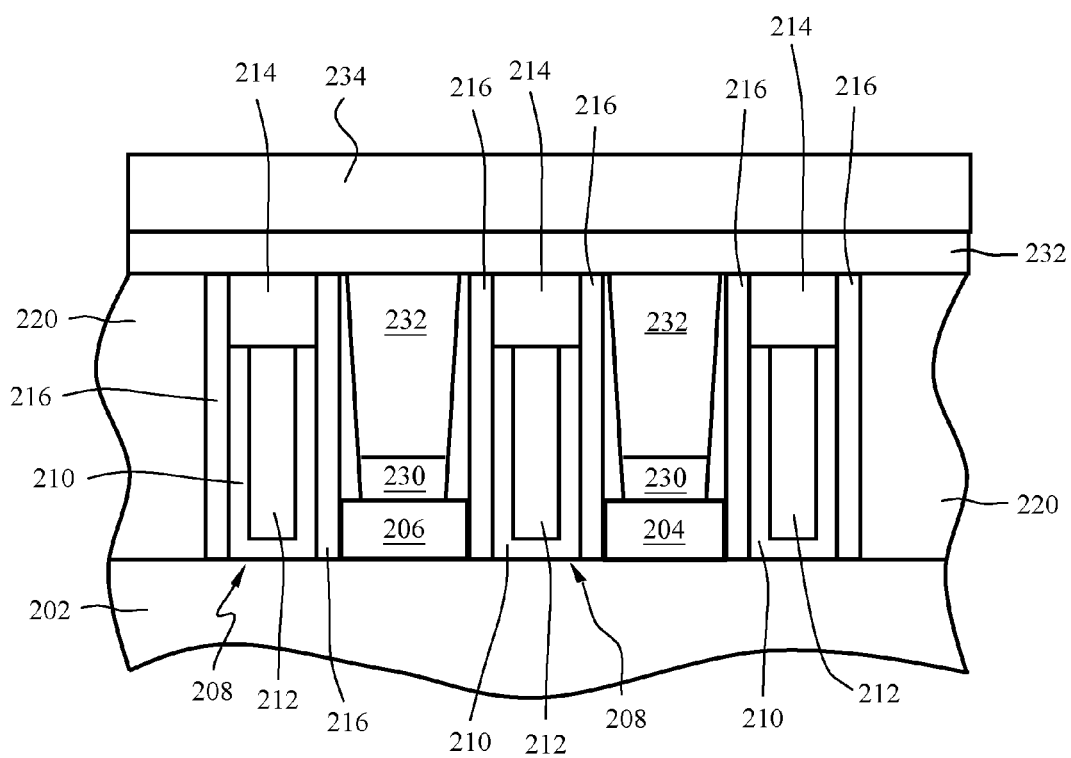
FIG. 13 depicts the structure of FIG. 12 after applying a photo resist layer, in accordance with one or more aspects of the present invention.
Figure 14:
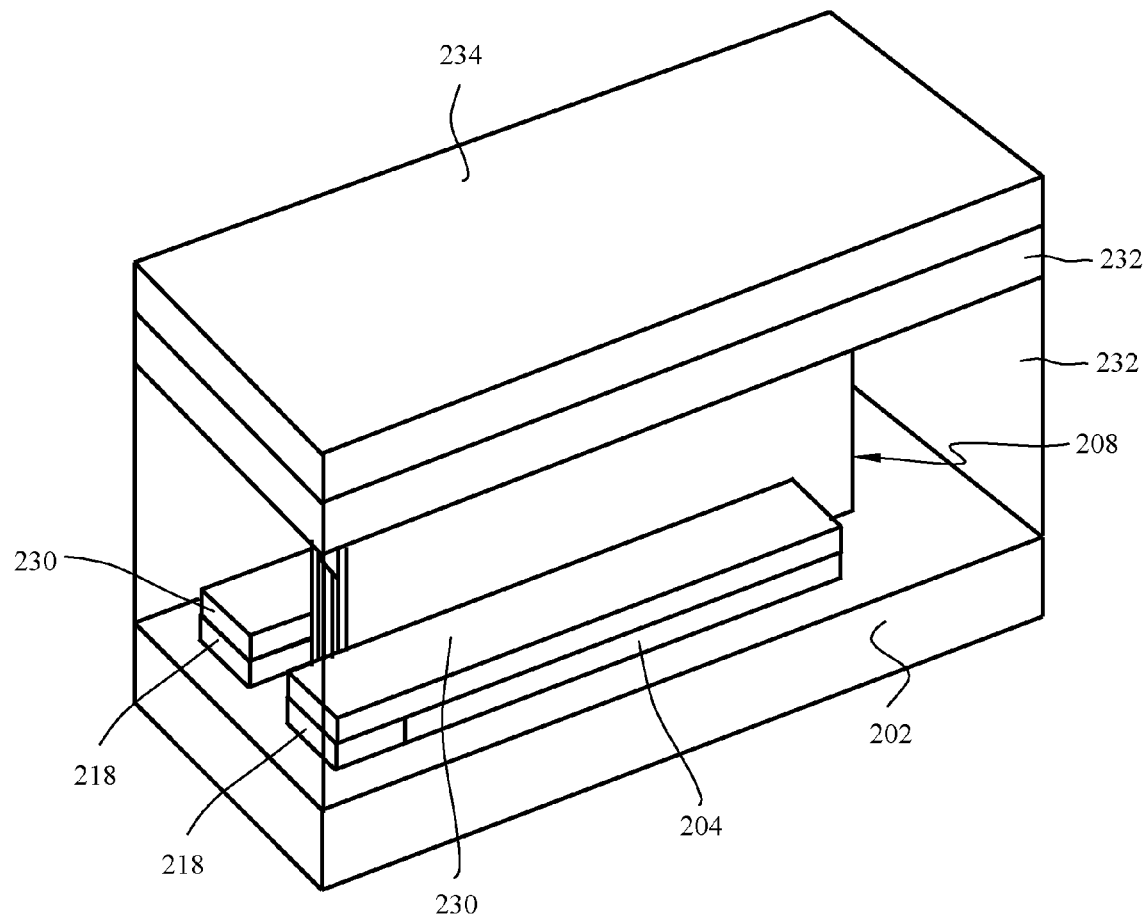
FIG. 14 depicts an isometric view of the structure of FIG. 13 with a transparent first oxide layer and a second oxide layer and photo resist layer applied over the device, in accordance with one or more aspects of the present invention.
Figure 15:
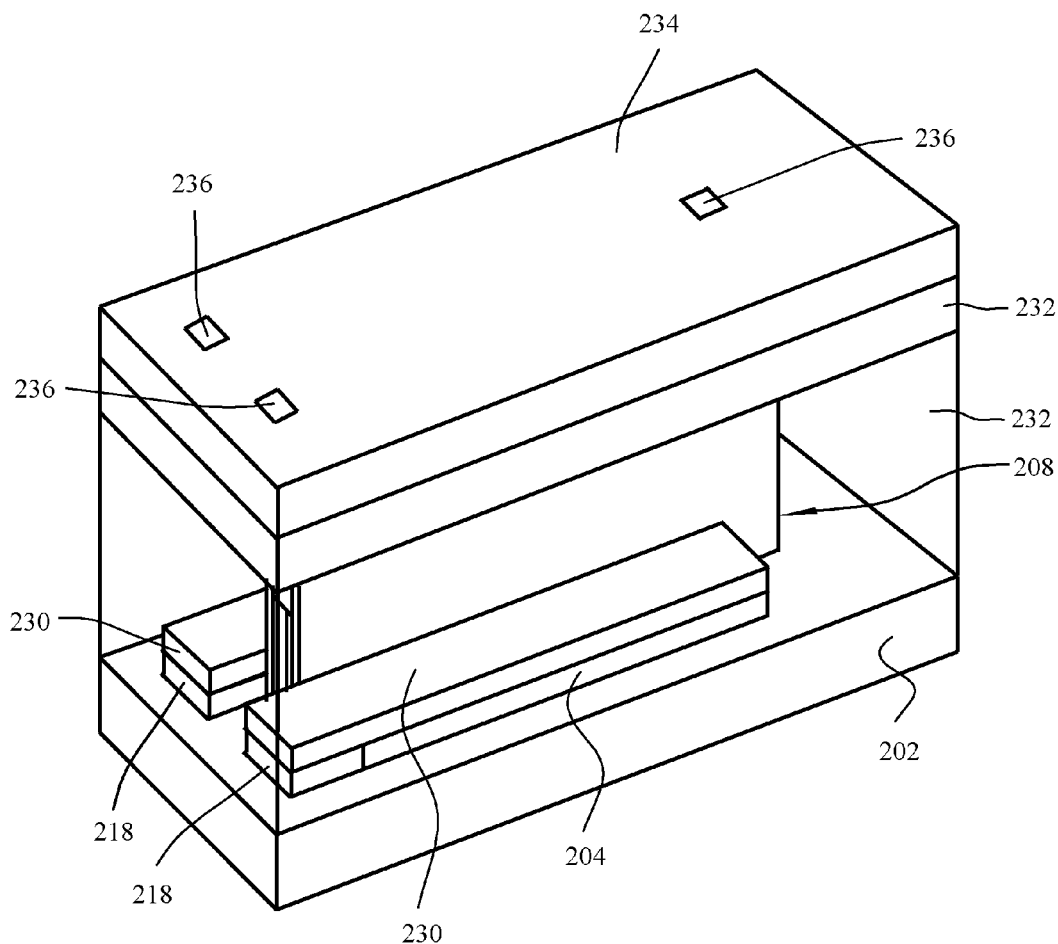
FIG. 15 depicts the structure of FIG. 14 after patterning the photo resist layer, in accordance with one or more aspects of the present invention.
Figure 16:
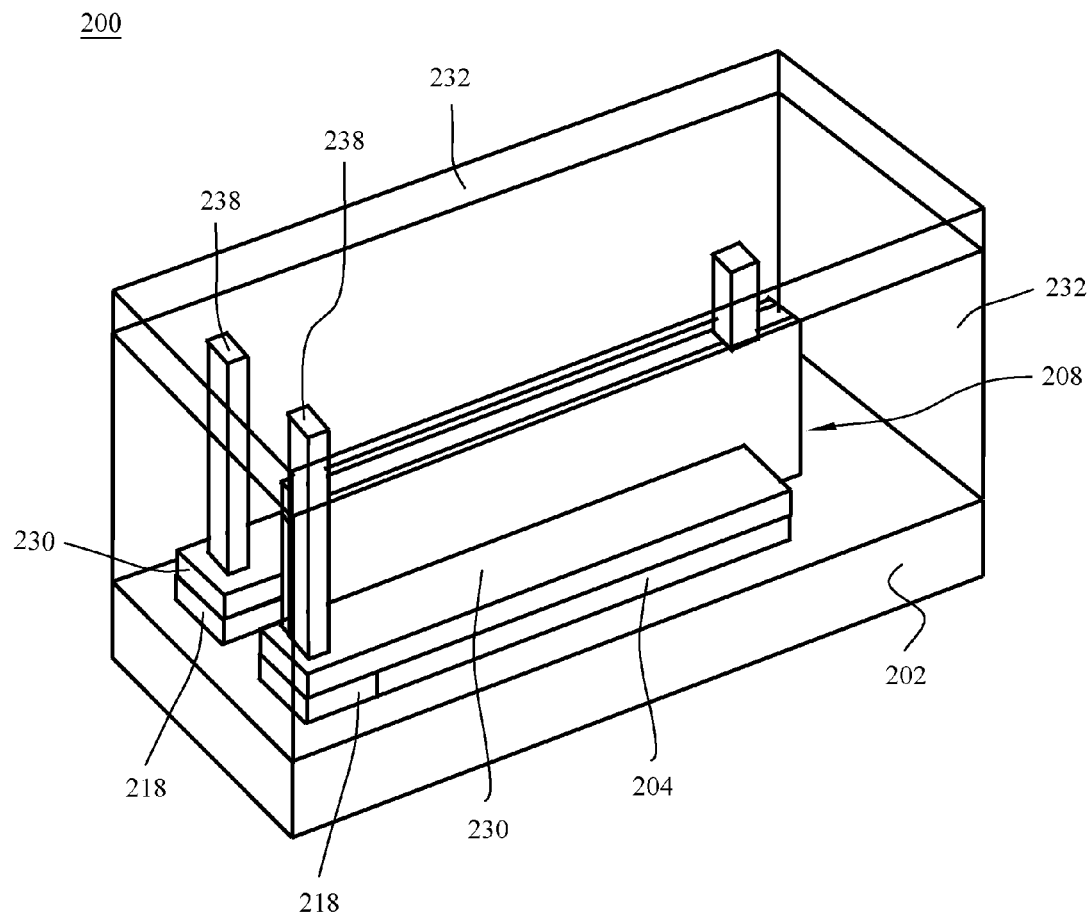
FIG. 16 depicts the structure of FIG. 15 after etching to form the small contact and gate contact openings and removing the photo resist layer, in accordance with one or more aspects of the present invention.
Figure 17:
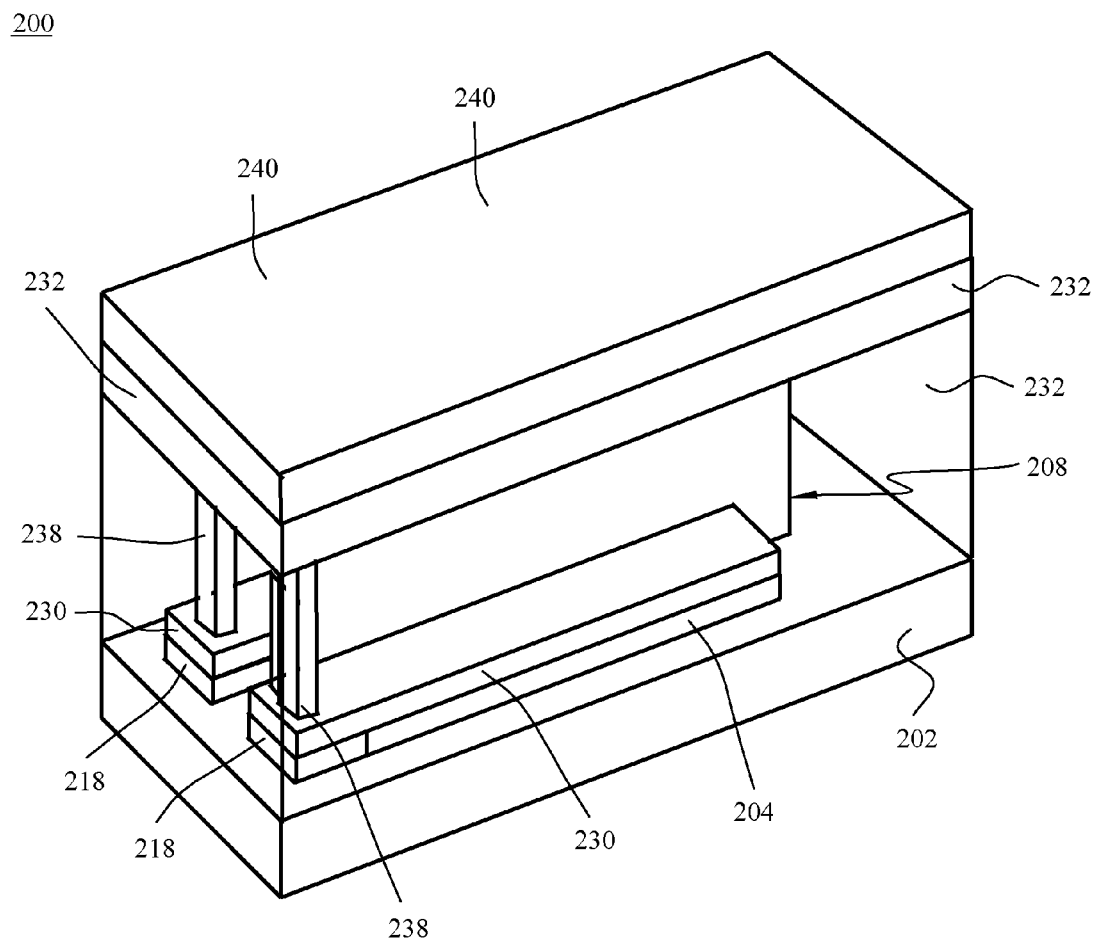
FIG. 17 depicts the structure of FIG. 16 after depositing a metal layer to form the small contacts and the gate contact, in accordance with one or more aspects of the present invention.
Figure 18:
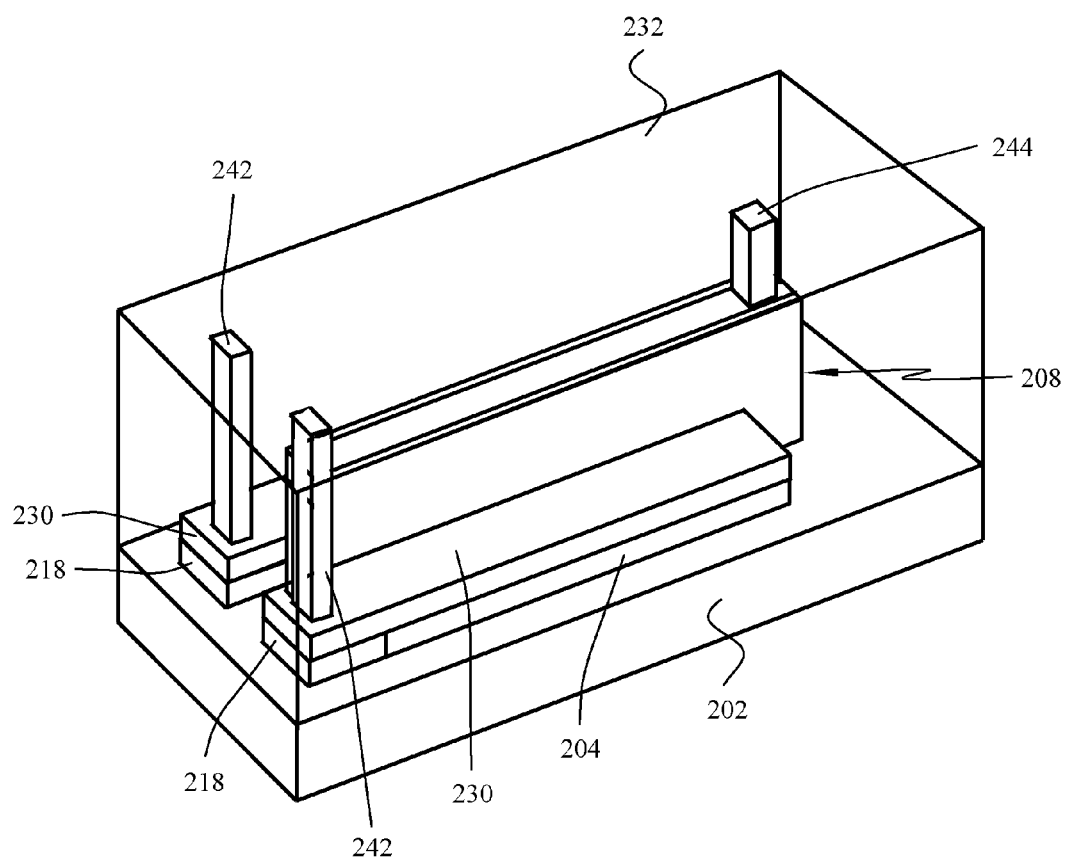
FIG. 18 depicts the structure of FIG. 17 after performing planarization of the device, in accordance with one or more aspects of the present invention.

Next, as shown in FIGS. 13 and 14, additional oxide 232 may be deposited over the device 200 and planarized and then a photo resist layer 234 may be deposited over the device 200. The additional oxide layer 232 may be planarized down to a position above the SAC cap 214. Once the photo resist layer 234 is applied, lithography may then be performed to pattern the photo resist layer 234 with openings 236 for the small contact formation, as shown in FIG. 15. Then the oxide layer 232 may be etched to form the small contact openings 238 and the photo resist layer 234 removed, as shown in FIG. 16. Following removal of the photo resist layer 234, as shown in FIG. 17, a second metal layer 240 may be deposited over the device 200 to fill the small contact openings 238. As depicted in FIG. 18, the device 200 may then be planarized by, for example, chemical mechanical planarization, to remove the excess metal from the second metal layer 240 to form contacts 242. Although only one small contact 242 is shown over each of the regions 218, it is contemplated that there may be more than one small contact 242 above each source 204 and drain 206 or the regions 218 adjacent to each source 204 and drain 206.

The contacts 242 may be positioned on the contact regions 230 over the regions 218 and offset from the at least one gate 208. The contacts 242 may be sized and offset from the gate 208 to reduce gate to contact capacitance and gate to contact short failure. As shown, the small contacts 242 may have a width smaller than the width of the contact regions 230 and a height, for example, greater than the height of the at least one gate 208. The small contacts 242 may have height of, for example, approximately 70 nm to 250 nm and, more specifically, approximately 90 nm to 160 nm. Optionally, as shown in FIGS. 15-18, the gate contacts 244 may be formed simultaneously with the formation of the contacts 242. Alternatively, after the formation of the contacts 242, another contact formation process may be completed as discussed above to form the gate contacts 244. The gate contacts 244, as shown in FIG. 18, may have a height of, for example, approximately 30 nm to 150 nm and, more specifically, approximately 40 nm to 80 nm. Once all the contacts 242, 244 are formed, the device 200 is ready for further processing, for example, back end of line processing.

Figure 19:
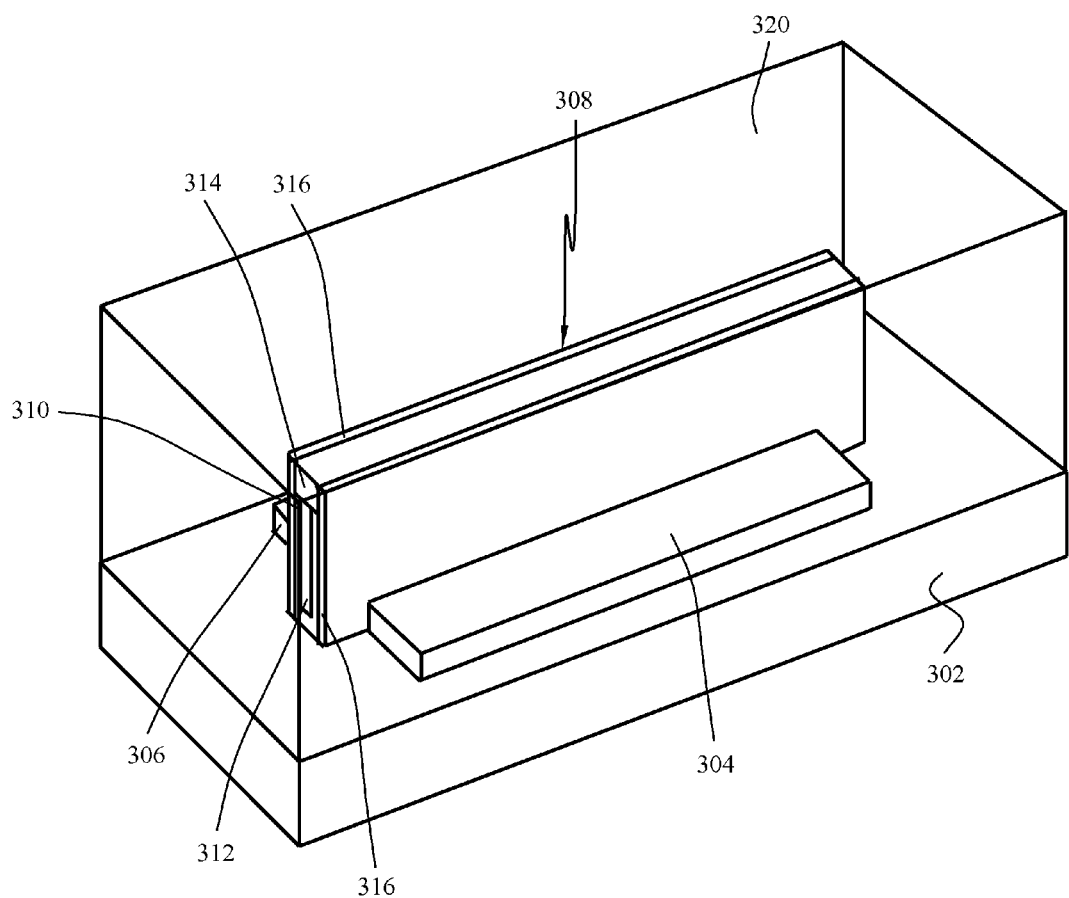
FIG. 19 depicts a perspective view of another embodiment of a portion of a semiconductor device with at least one gate, a source, and a drain, in accordance with one or more aspects of the present invention.

FIGS. 19-23 depict, by way of example only, an alternative embodiment of a portion of the FinFET device formation process of FIG. 1. Note again that these figures are not drawn to scale in order to facilitate understanding of the invention, and that the same reference numerals are used throughout different figures to designate the same or similar elements. FIG. 19 shows a portion of a semiconductor device 300 obtained during the fabrication process. The device 300 may have been processed through initial device processing steps in accordance with the design of the device 300 being fabricated. The device 300 may include, for example, an isolation region 302, at least one source region 304, at least one drain region 306, and at least one gate 308. The isolation region 302, at least one source region 304, at least one drain region 306, and at least one gate 308 may be of the type described above with reference to the isolation region 202, at least one source region 204, at least one drain region 206, and at least one gate 208, which will not be described again here for brevity sake. The at least one gate 308 may be, for example, positioned over one or more fins (not shown). The at least one source region 304 and at least one drain region 306 may be, for example, positioned adjacent to the at least one gate 308. The at least one gate 308 may be of the type described above with reference to gate 208, which will not be described again here in detail for brevity sake. The at least one gate 308 may include, for example, at least one work function metal 310, a gate metal 312, a SAC cap 314 positioned over the metals 310, 312, and a spacer 316 positioned on each side of the work function metal 310 and SAC cap 314. The device 300 may be covered with an oxide layer 332, which may be of the type described above with reference to oxide layer 232 and which will not be described again here for brevity sake.

The device 300 of FIG. 19 may then be processed through the fabrication processes described in greater detail above with reference to FIGS. 4-14. The device 300 may be processed to form regions 318 adjacent to both a first end and a second end of the at least one source region 304 and the at least one drain region 306. As described above in greater detail with reference to regions 218, which will not be described again here for brevity sake, the regions 318 may be, for example, an oxide or a metal. The contact regions 330 may be positioned over the regions 318 and the at least one source region 304 and at least one drain region 306.

Figure 20:
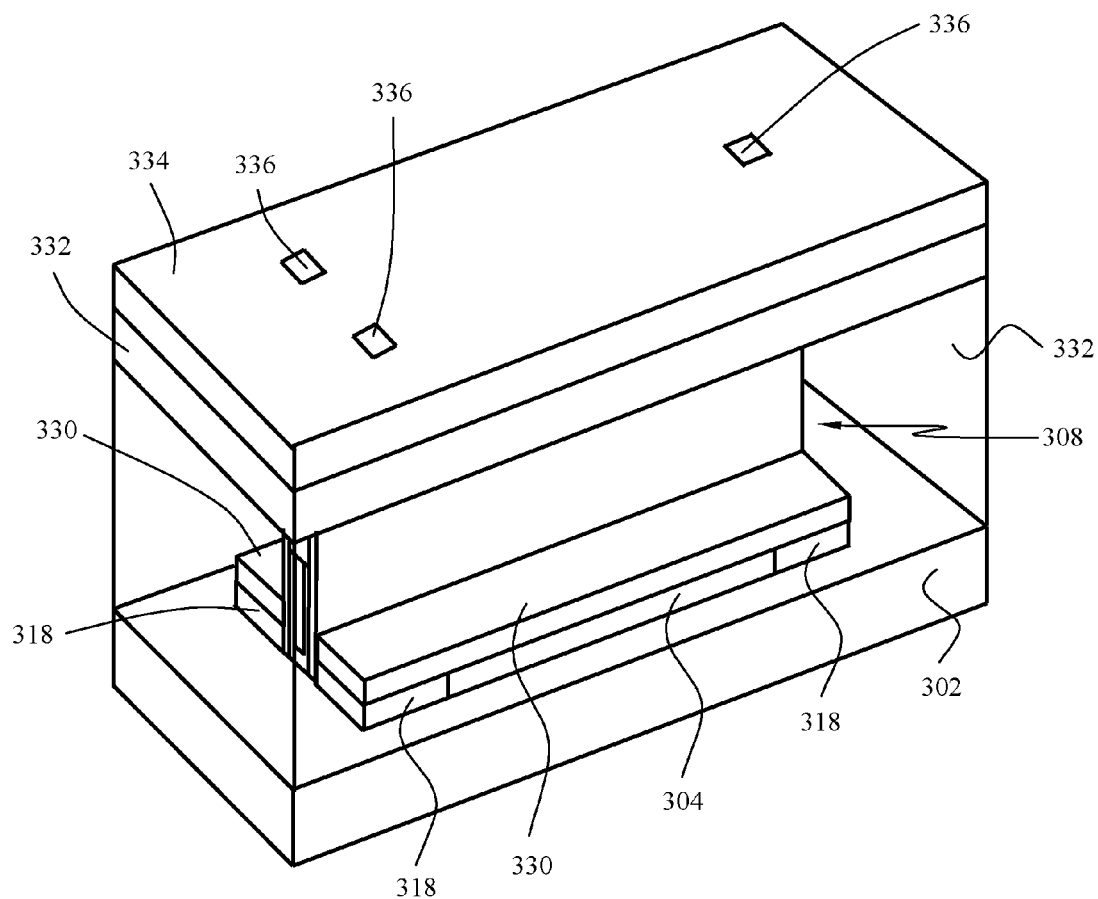
FIG. 20 depicts the structure of FIG. 19 after being processed through the steps of FIGS. 4-14 and after patterning the photo resist layer, in accordance with one or more aspects of the present invention.
Figure 21:
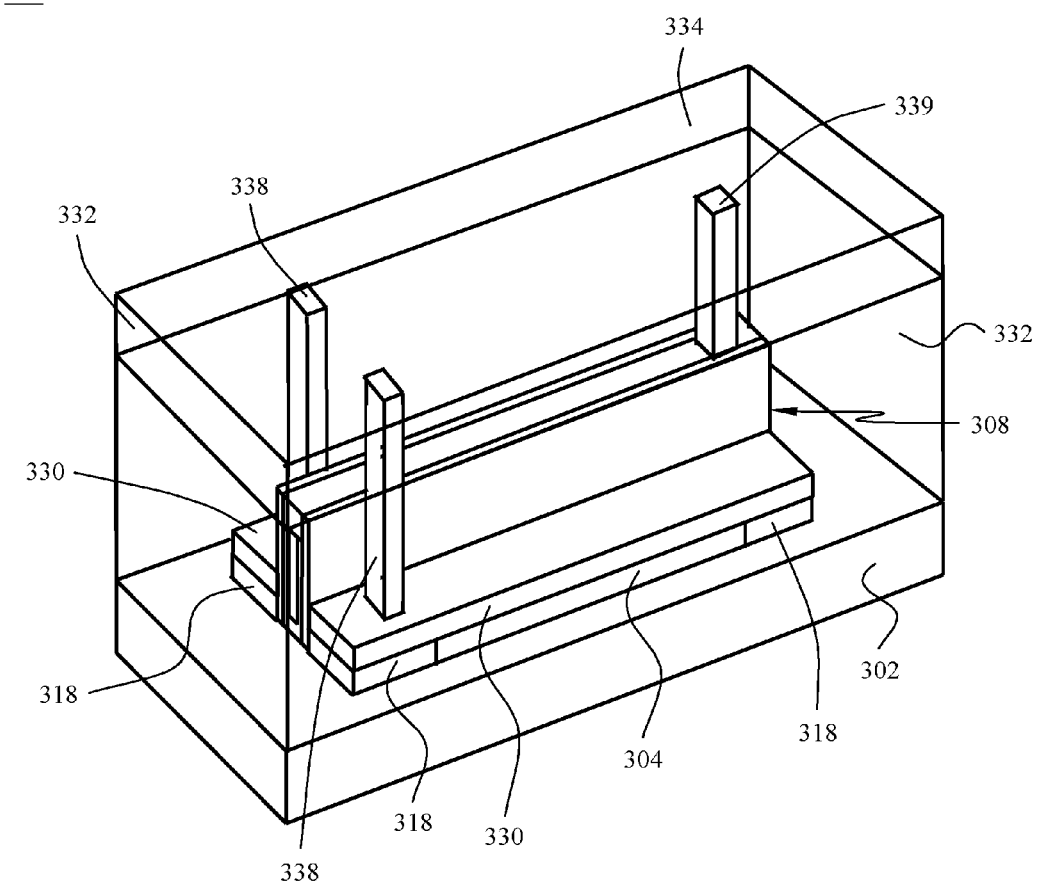
FIG. 21 depicts the structure of FIG. 20, with a transparent first oxide layer, after etching to form small contact and gate contact openings and removing the photo resist layer, in accordance with one or more aspects of the present invention.
Figure 22:
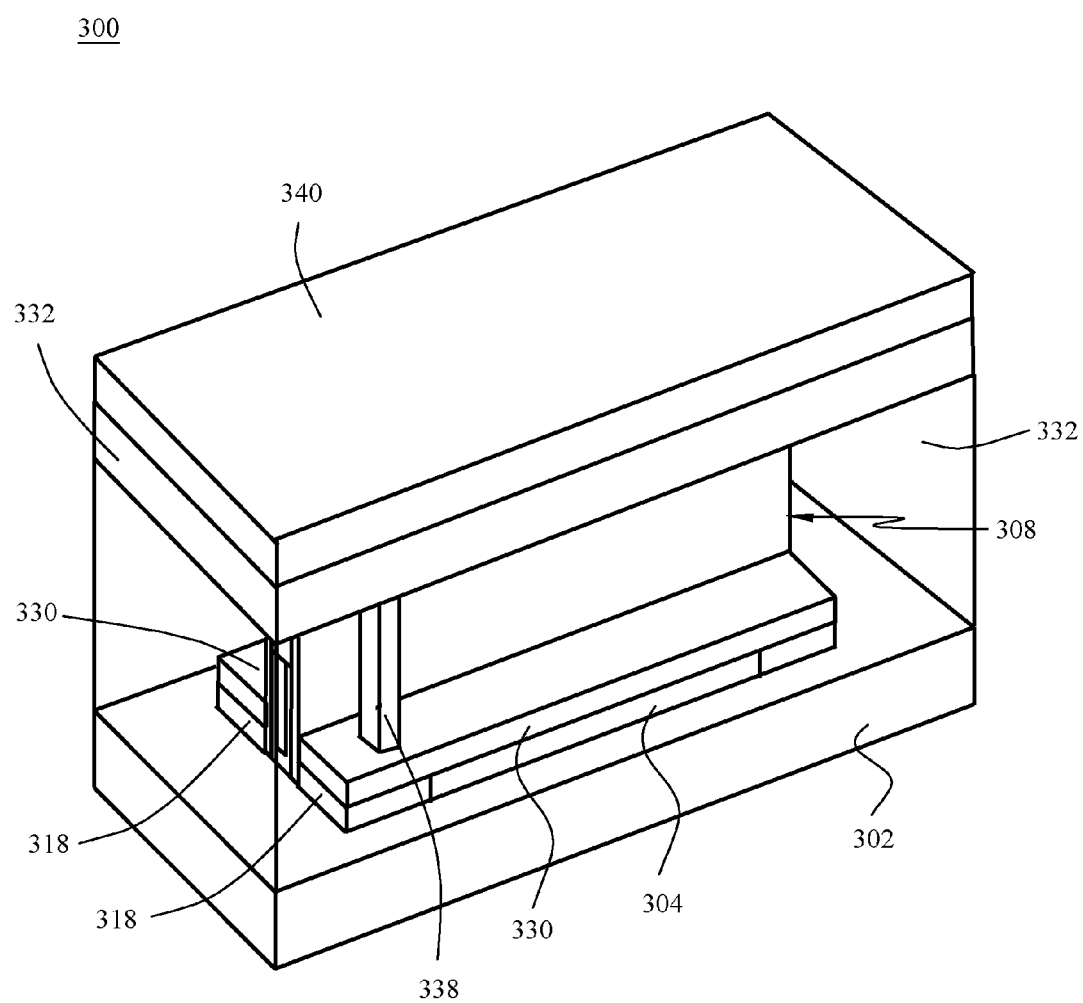
FIG. 22 depicts the structure of FIG. 21 after depositing a metal layer to form the small contacts and gate contact, in accordance with one or more aspects of the present invention.
Figure 23:
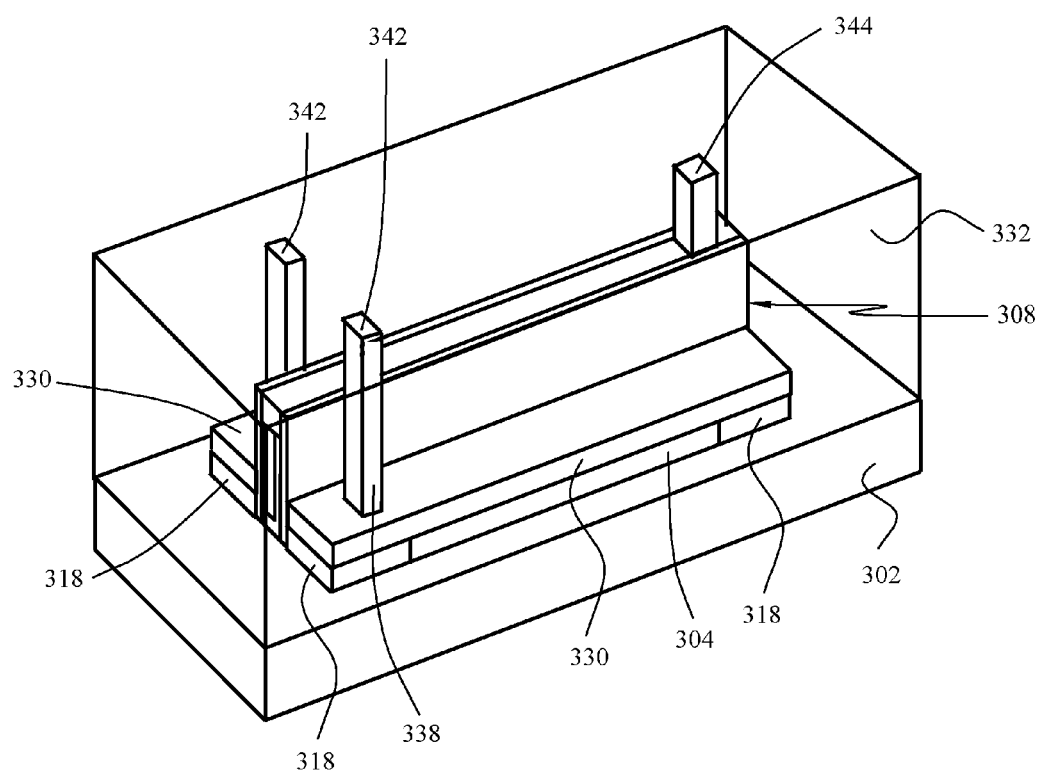
FIG. 23 depicts the structure of FIG. 22 after performing planarization on the device, in accordance with one or more aspects of the present invention.

Next, lithography may be performed to pattern the photo resist layer 334 deposited over the device 300. As shown in FIG. 20, the lithography may be used to form openings or cavities 336 in the photo resist layer 334. The device 300 may then be etched to extend the openings 336 down to the contact regions 330 to form the small contact openings 338 and gate openings 339 and the photo resist layer 334 may be removed, as shown in FIG. 21. Next, as shown in FIG. 22, a second metal layer 340 may be deposited over the device 300 and into the small contact openings 338 and gate openings 339. As depicted in FIG. 23, the device 300 may then be planarized by, for example, chemical mechanical planarization, to remove the excess metal from the second metal layer 340 and to form small contacts 342 and gate contacts 344. The small contacts 342 may be positioned, for example, next to or adjacent to the at least one gate 308. As shown, the small contacts 342 may have a width, for example, smaller than the width of the contact regions 330 and a height, for example, greater than the height of the at least one gate 308. The small contacts 342 may have a height of, for example, approximately 70 nm to 250 nm and, more specifically, approximately 90 nm to 160 nm. The contacts 342 may be sized and positioned to reduce gate to contact capacitance and gate to contact short failure. Although only one small contact 342 is shown, it is contemplated that there may be one or more small contacts 342 above each source 304 and drain 306 or the regions 318 adjacent to each source 304 and drain 306.

Optionally, the gate contacts 344 may be formed after the formation of the contacts 342, by completing another contact formation process as discussed above to form the gate contact 344 over the gate 308. The gate contact 344, as shown in FIG. 23, may have a height of, for example, approximately 30 nm to 150 nm and, more specifically, approximately 40 nm to 80 nm. After formation of the contacts 342, 344, the device 300 may be passed along for further processing, for example, back end of line processing.

Figure 24:
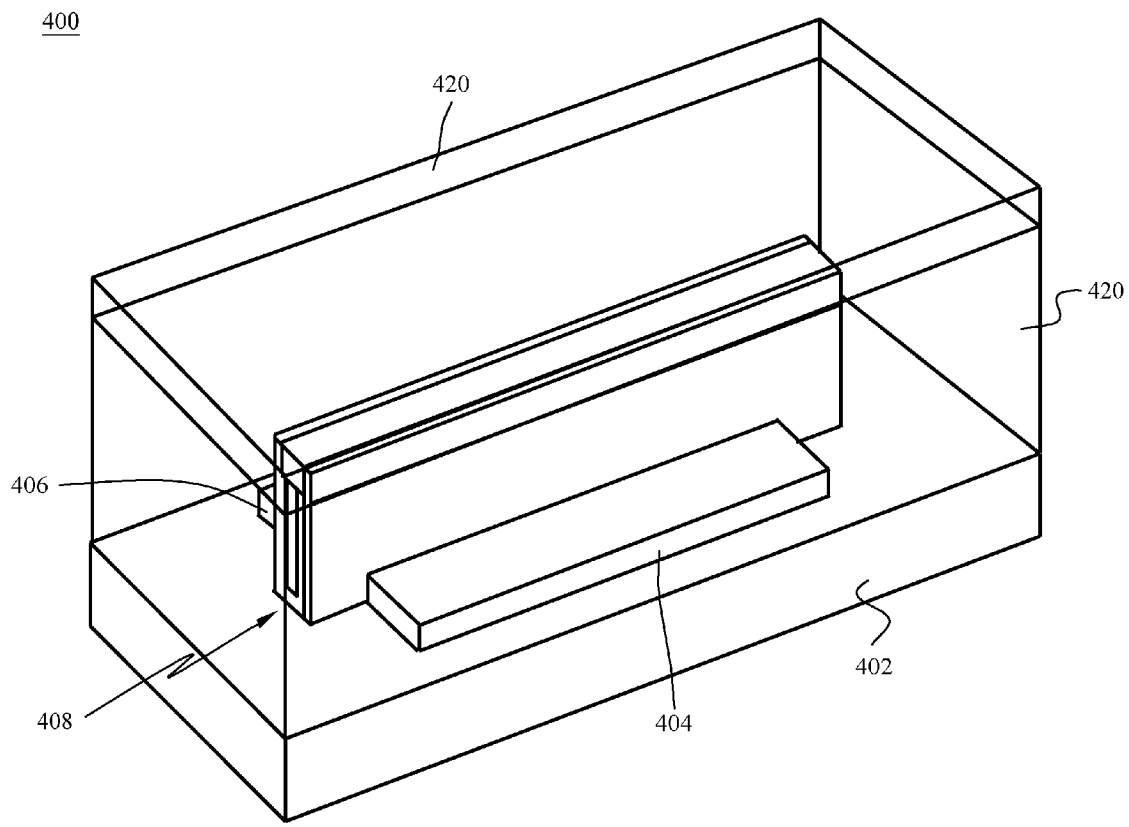
FIG. 24 depicts an isometric view of another portion of a semiconductor device with at least one gate, a source, a drain, and an oxide layer deposited over the device, in accordance with one or more aspects of the present invention.

FIGS. 24-32 show another alternative embodiment of the fabrication process or method of FIG. 1 for the semiconductor device 400. FIG. 24 shows a portion of a semiconductor device 400 obtained during the fabrication process. The device 400 may have been processed through initial device processing steps in accordance with the design of the device 400 being fabricated. The device 400 may include, for example, an isolation region 402, at least one source region 404, at least one drain region 406, and at least one gate 408. The isolation region 402, at least one source region 404, at least one drain region 406, and at least one gate 408 may be of the type described above with reference to isolation regions 202, 302, source regions 204, 304, drain regions 206, 306, and gates 208, 308, which will not be described again here for brevity sake. The at least one source region 404 and at least one drain region 406 may be, for example, positioned adjacent to the at least one gate 408. The at least one gate 408 may be positioned over, for example, one or more fins (not shown). The at least one gate 408 may include, for example, at least one work function metal 410, a gate metal 412, an SAC cap 414 positioned over the metals 410, 412, and a spacer 416 positioned on each side of the work function metal 410 and SAC cap 414. The device 400 may be covered by an oxide layer 420 which may be of the type described above with reference to oxide layers 220, 320, which will not be described again here for brevity sake. A second oxide layer 420 may also have been deposited over the device 400 as shown in FIG. 24.

The device 400 may also be processed to form regions 418 adjacent to a first end of the at least one source region 404 and the at least one drain region 406. As described above in greater detail with reference to regions 218, which will not be described again here for brevity sake, the regions 418 may be, for example, an oxide or a metal. The small contacts 442 may be positioned over the regions 418 as well as the at least one source region 404 and at least one drain region 406.

Figure 25:
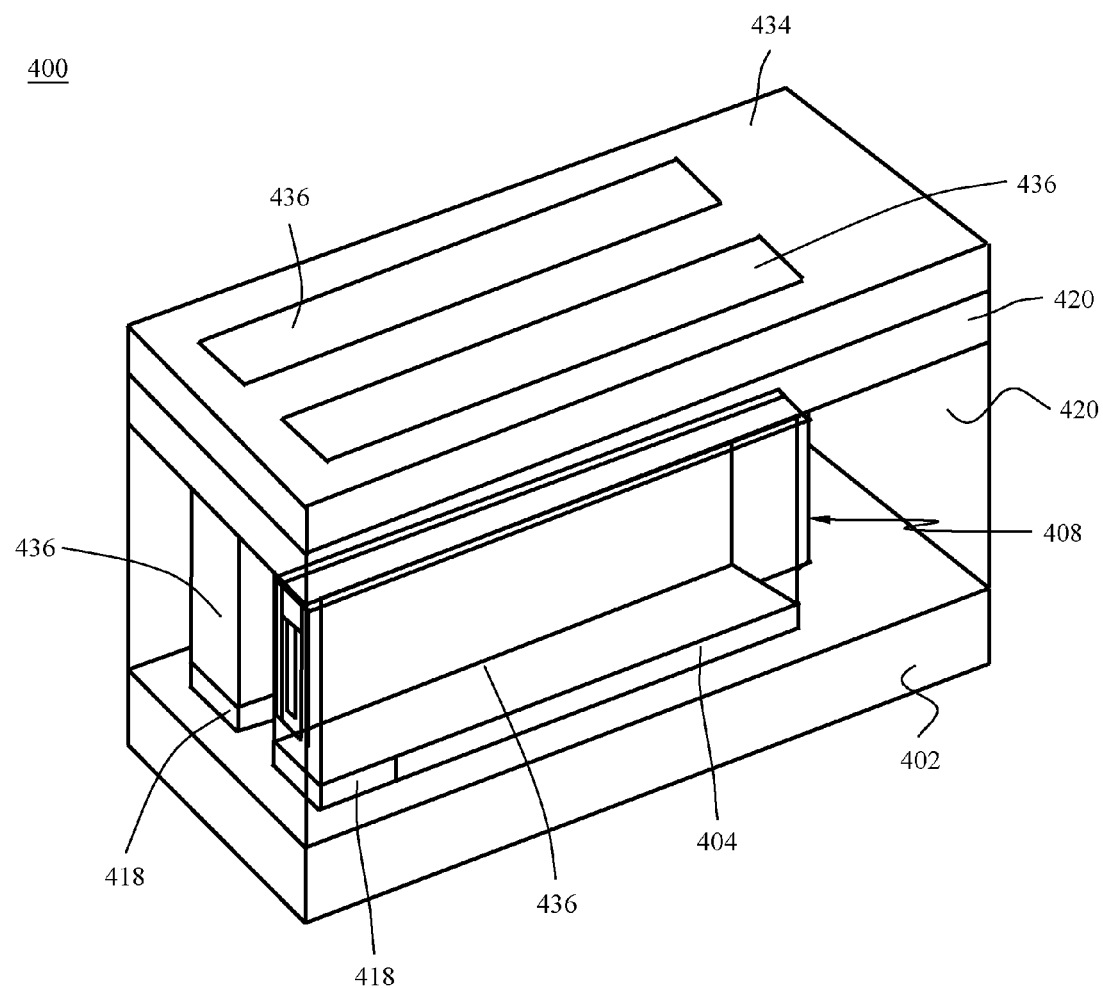
FIG. 25 depicts an isometric view of the structure of FIG. 24, with a photo resist layer deposited over the device and patterned to form the contact regions, in accordance with one or more aspects of the present invention.
Figure 26:
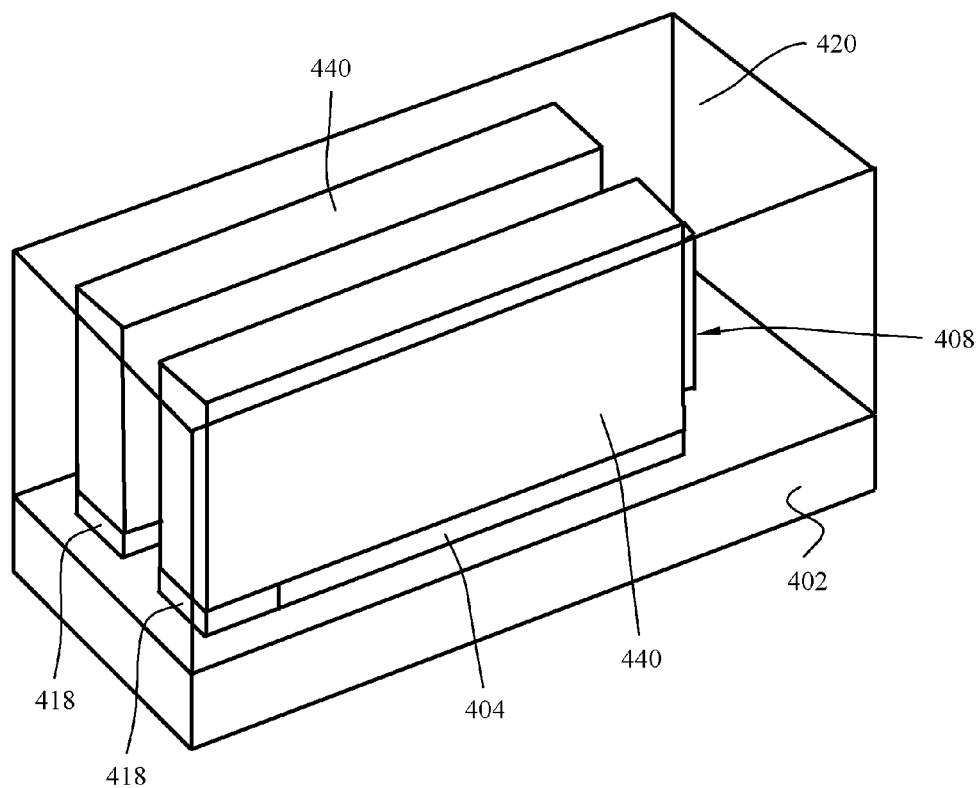
FIG. 26 depicts the structure of FIG. 25 after removing the photo resist layer, depositing a first metal layer into the contact cavities, and planarizing the device, in accordance with one or more aspects of the present invention.
Figure 27:
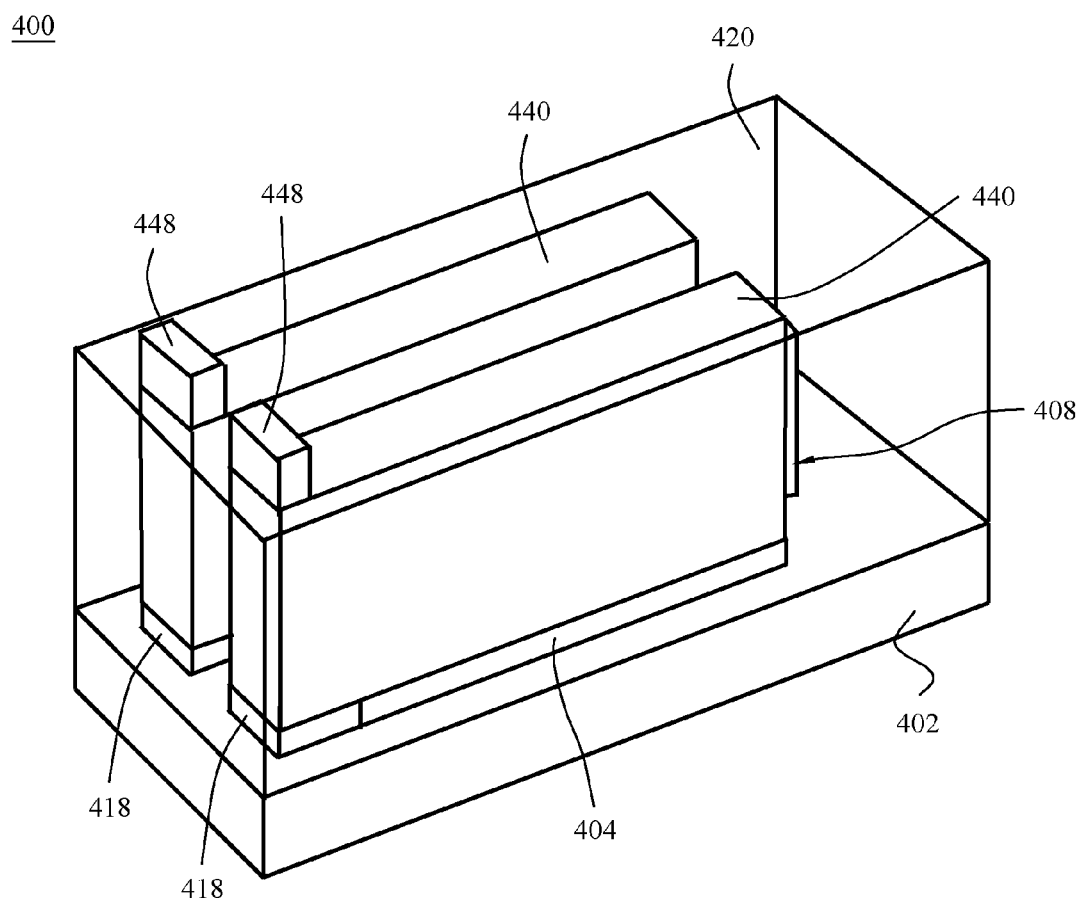
FIG. 27 depicts the structure of FIG. 26 after applying and patterning a second photo resist layer, in accordance with one or more aspects of the present invention.
Figure 28:
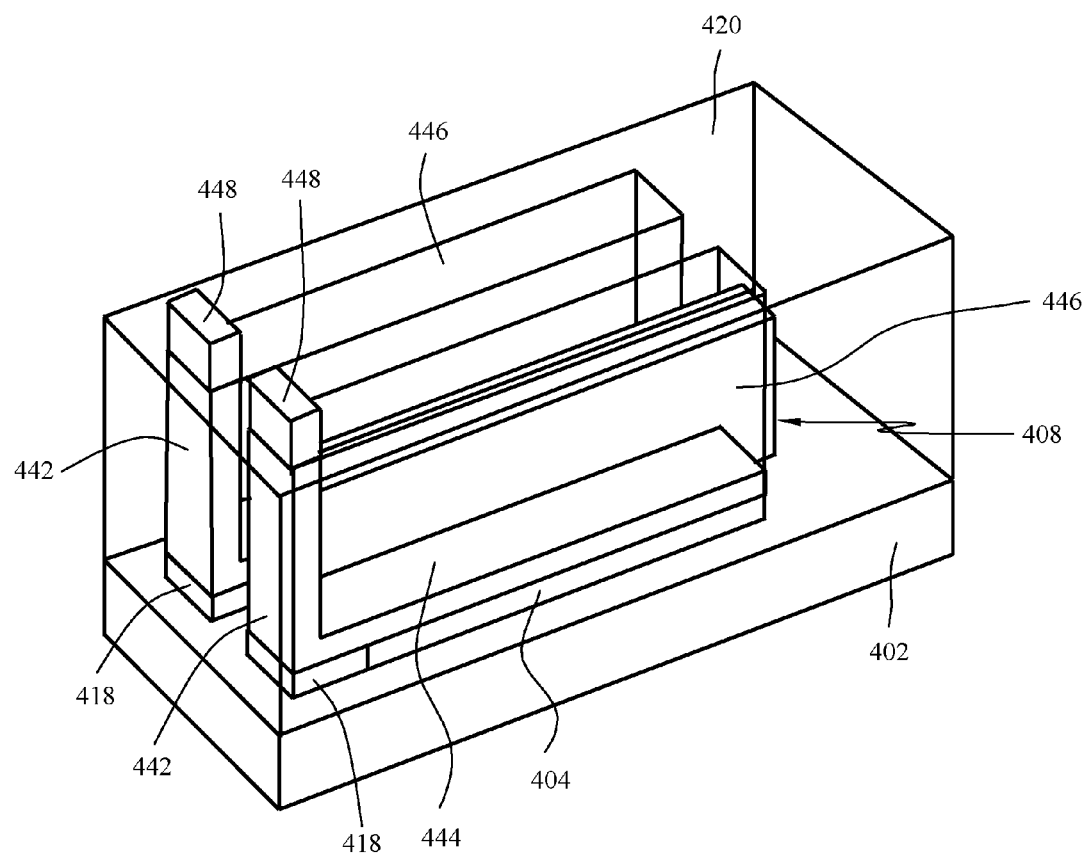
FIG. 28 depicts the structure of FIG. 27 after etching the first metal layer to form a partial recess, in accordance with one or more aspects of the present invention.
Figure 29:
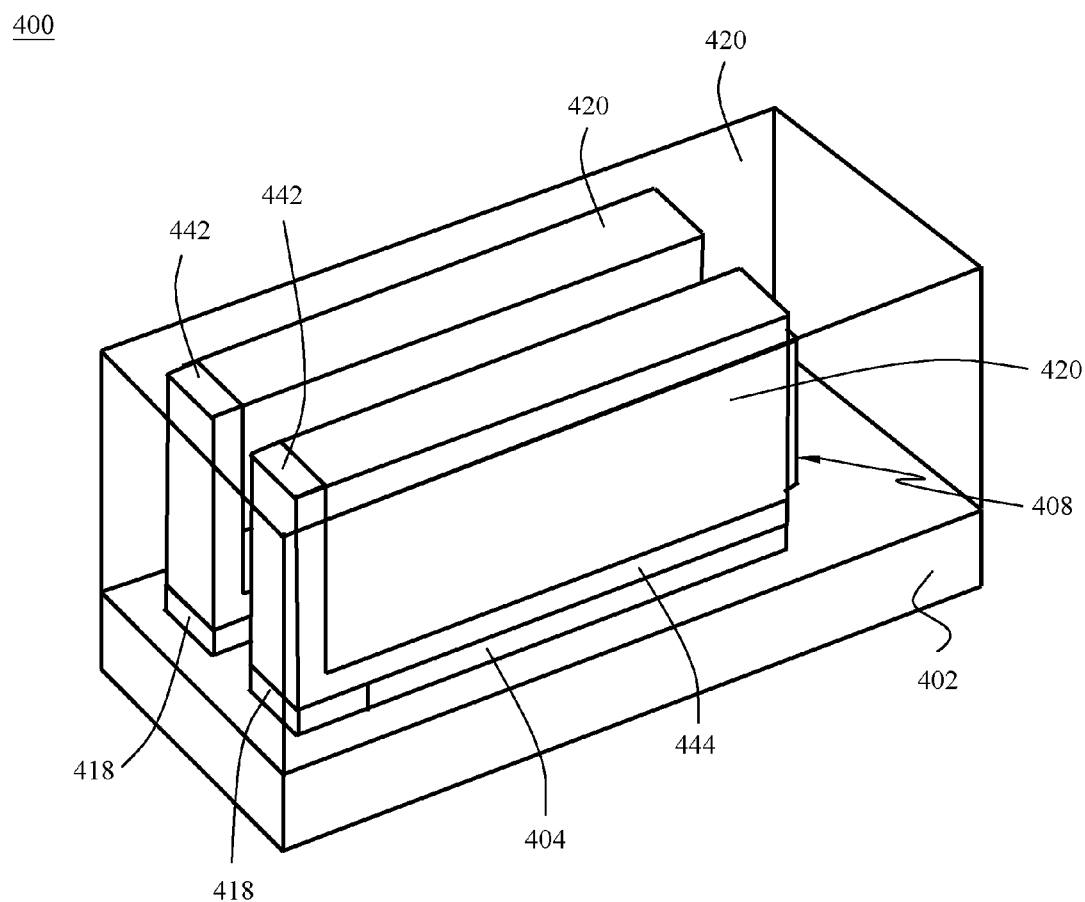
FIG. 29 depicts the structure of FIG. 28 after removing the second photo resist layer, in accordance with one or more aspects of the present invention.

Lithography and etching may then be performed on the device 400 to form openings 436 in the oxide layers 420, as shown in FIG. 25. Then, the photo resist layer 434 may be removed. For ease of illustration in FIGS. 26-28, the oxide layers 420 will be shown as a single oxide layer 420. Next, a metal layer may be deposited over the device 400 to fill the openings 436 and the device may be planarized to remove the excess metal layer to form metal regions 440, as shown in FIG. 26. Then, as shown in FIG. 27, a second photo resist layer 448 may be applied over the device 400 and patterned to cover only a portion of the contact regions 440. Next, the device 400 may be partially etched to remove a portion of the metal in contact regions 440 to form small contacts 442, contact regions 444, and openings 446, as shown in FIG. 28. The contact regions 444 may be, for example, shorter than the small contacts 442 and positioned over the source region 404 and drain region 406, as well as at least a portion of the regions 418. As shown in FIG. 29, once the small contacts 442 are formed, the second photo resist layer 448 may be removed and additional oxide 420 may be deposited over the device 400 to fill the openings 446. After the additional oxide 420 is deposited, a planarization, for example chemical mechanical planarization, may be performed down to the tops of the small contacts 442 of the device 400. The original oxide layer 420 and additional oxide 420 combine to form an oxide layer 432 over the device 400, as shown as a transparent layer 432 in FIG. 30. As illustrated, the small contacts 442 may have a width equal to the width of the at least one source region 404 and at least one drain region 406 and a height, for example, greater than the height of the at least one gate 408. The small contacts 442 may have height of, for example, approximately 70 nm to 250 nm and, more specifically, approximately 90 nm to 160 nm. The contacts 442 may be sized and offset from the gate 408 to reduce gate to contact capacitance and gate to contact short failure. Although only one small contact 442 is shown, it is contemplated that there may be one or more small contacts 442 over each source 404 and drain 406 or the regions 418 adjacent to each source 404 and drain 406.

Figure 30:
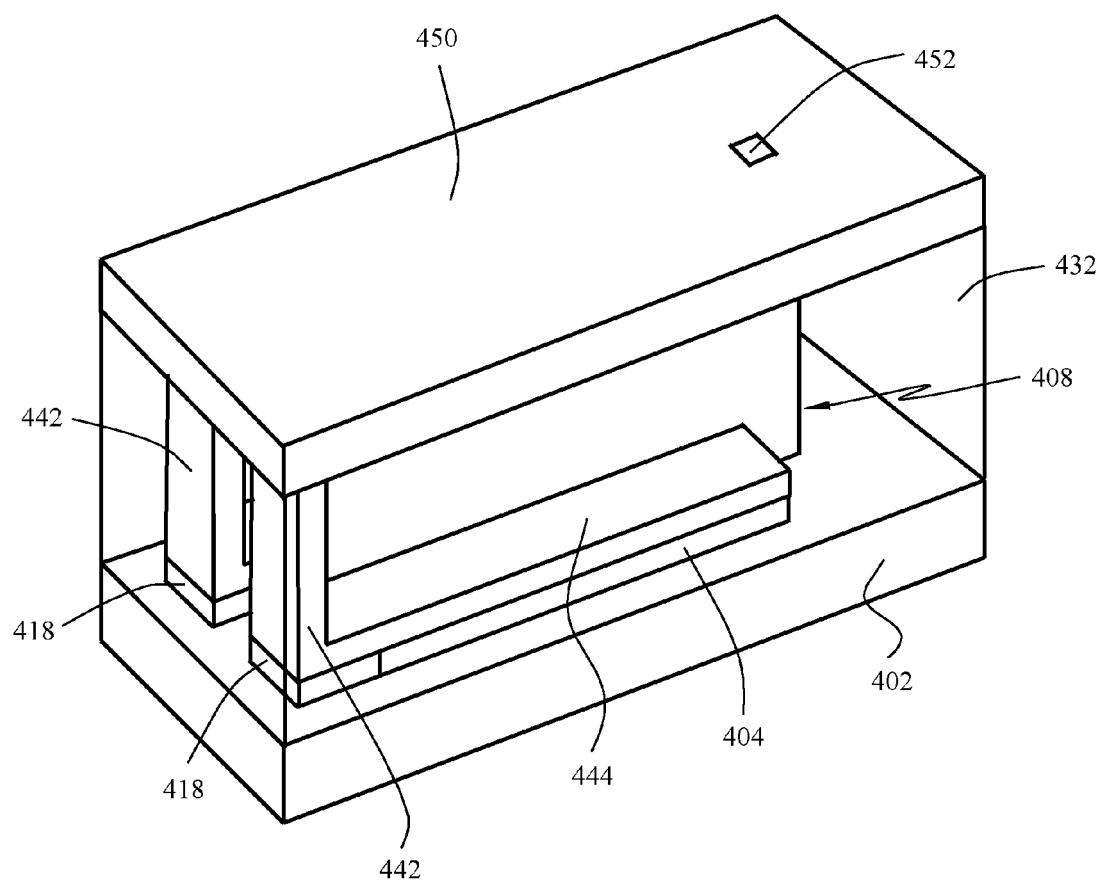
FIG. 30 depicts the structure of FIG. 29 after depositing a second oxide layer, planarizing the second oxide layer, and performing a reactive ion etch to form the gate contact, in accordance with one or more aspects of the present invention.
Figure 31:
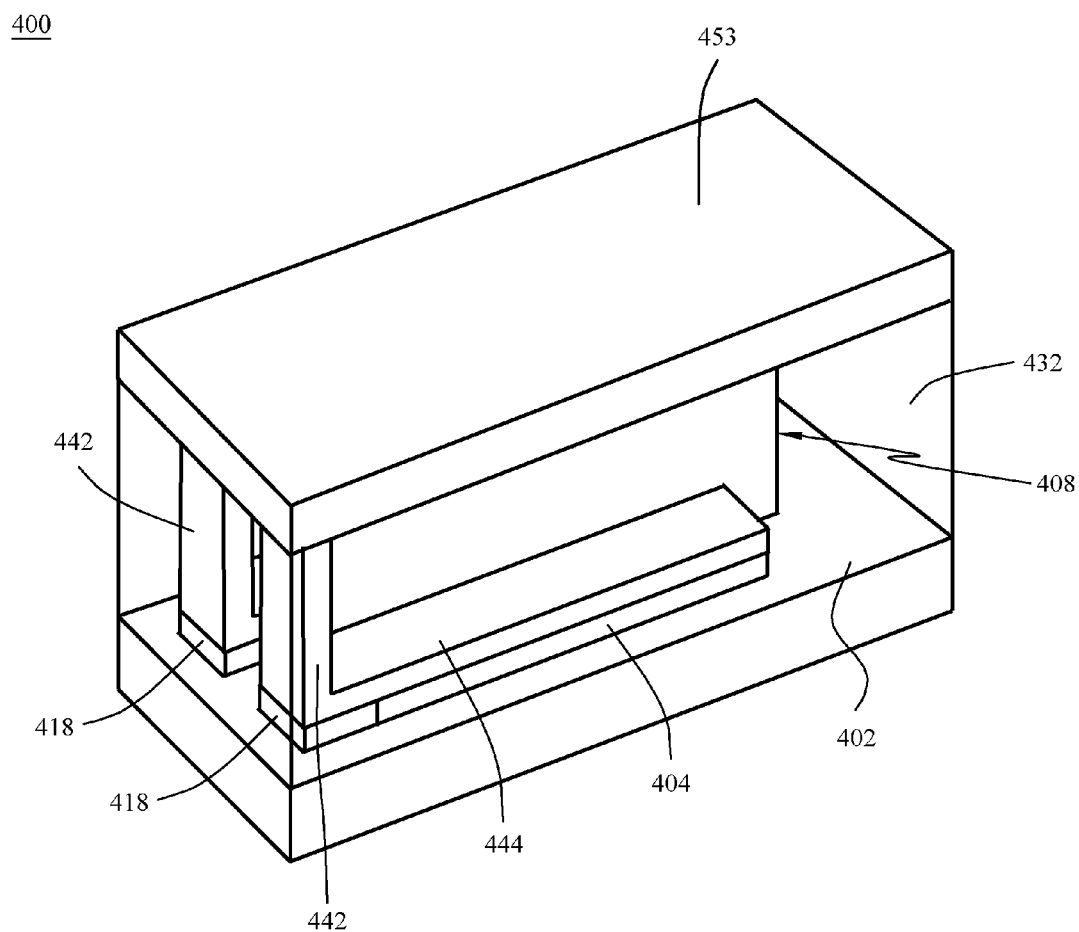
FIG. 31 depicts the structure of FIG. 30 after depositing a metal to form a gate contact, in accordance with one or more aspects of the present invention.
Figure 32:
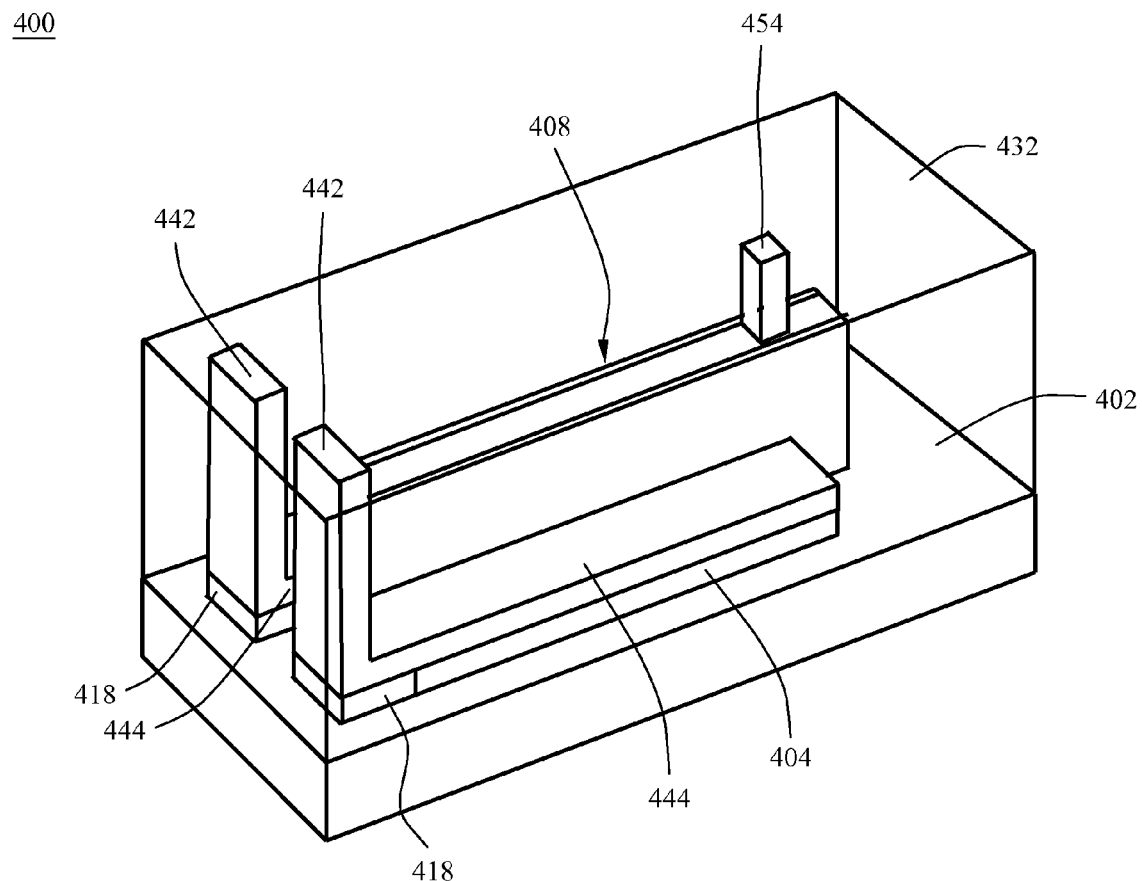
FIG. 32 depicts the structure of FIG. 31 after performing planarization on the device to remove the excess gate metal, in accordance with one or more aspects of the present invention.

With continued reference to FIG. 30, a third photo resist layer 450 may be deposited over the device 400 and patterned to form at least one gate opening 452. The at least one gate opening 452 may be formed by, for example, reactive ion etch. Once the at least one gate opening 452 is formed, the photo resist layer 450 may be removed and a metal layer 453 may be deposited over the device 400 and into openings 452, as shown in FIG. 31. The metal layer 453 may then be planarized to remove any excess metal over the device 400 by, for example, chemical mechanical planarization, to form gate contacts 454, as shown in FIG. 32. The gate contact 454, as shown in FIG. 32, may have a height of, for example, approximately 30 nm to 150 nm and, more specifically, approximately 40 nm to 80 nm. Once the contacts 442, 454 are formed, the device 400 may be passed for further processing, for example, back end of line processing.

Figure 33:
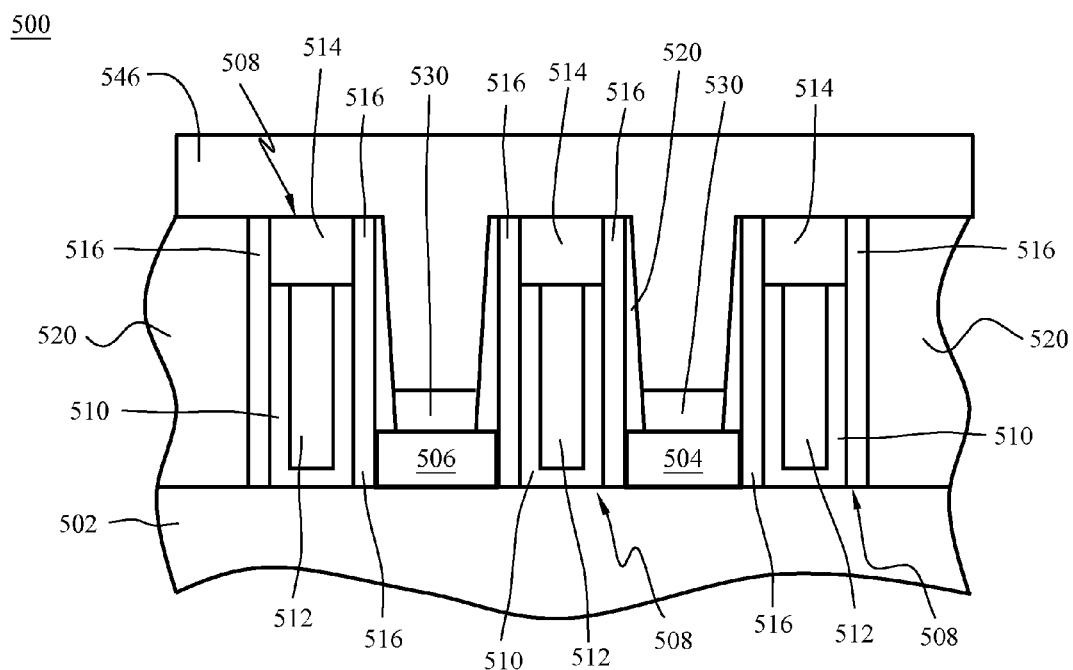
FIG. 33 depicts the structure of FIG. 9 after depositing a low k material over the device, in accordance with one or more aspects of the present invention.

FIGS. 33-44 depict, by way of example only, yet another alternative embodiment of a portion of a FinFET device during the formation process of FIG. 1. FIG. 33 shows a portion of a semiconductor device 500 obtained during the fabrication process. The device 500 may have been processed through initial device processing steps in accordance with the design of the device 500 being fabricated. The device 500 may include, for example, an isolation region 502, at least one source region 504, at least one drain region 506, and at least one gate 508. The isolation region 502, at least one source region 504, at least one drain region 506, and at least one gate 508 may be of the type described above with reference to isolation regions 202, 302, 402, source regions 204, 304, 404, drain regions 206, 306, 406, and gates 208, 308, 408, which will not be described again here for brevity sake. The at least one gate 508 may be positioned over one or more fins (not shown). The at least one source region 504 and at least one drain region 506 may be, for example, positioned adjacent to the at least one gate 508. The at least one gate 508 may include, for example, at least one work function metal 510, a gate metal 512, an SAC cap 514 positioned over the metals 510, 512, and a spacers 516 positioned on each side of the work function metal 510 and SAC cap 514.

The device 500 may also be processed to form regions 518 adjacent to a first end of the at least one source region 504 and the at least one drain region 506. As described above in greater detail with reference to regions 218, which will not be described again here for brevity sake, the regions 518 may be, for example, an oxide or a metal. The contacts regions 530 may be positioned over the regions 518 as well as the at least one source region 504 and at least one drain region 506.

Figure 34:
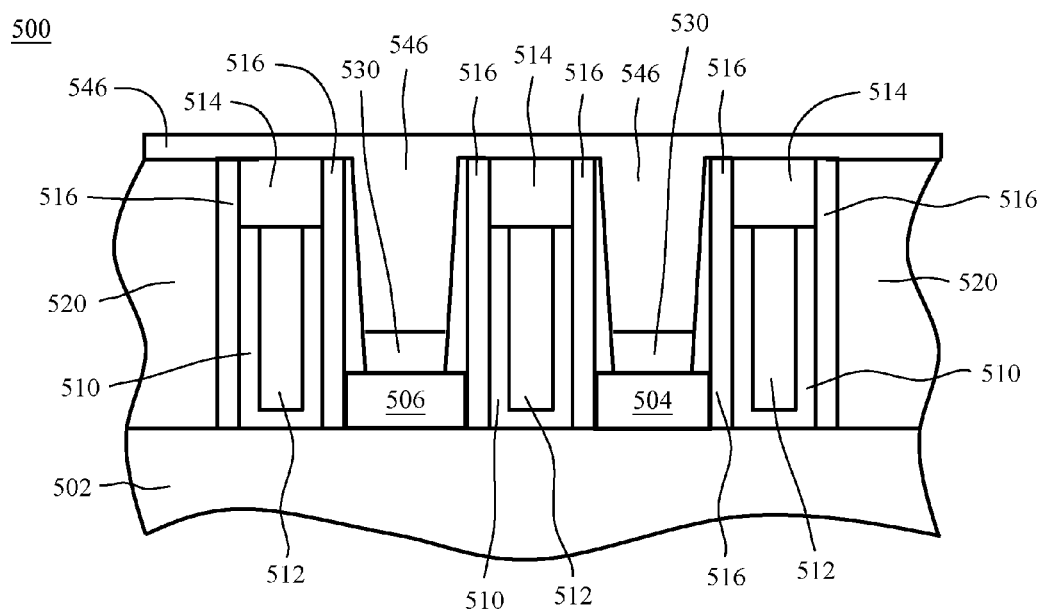
FIG. 34 depicts the structure of FIG. 33 after performing planarization to the device, in accordance with one or more aspects of the present invention.
Figure 35:
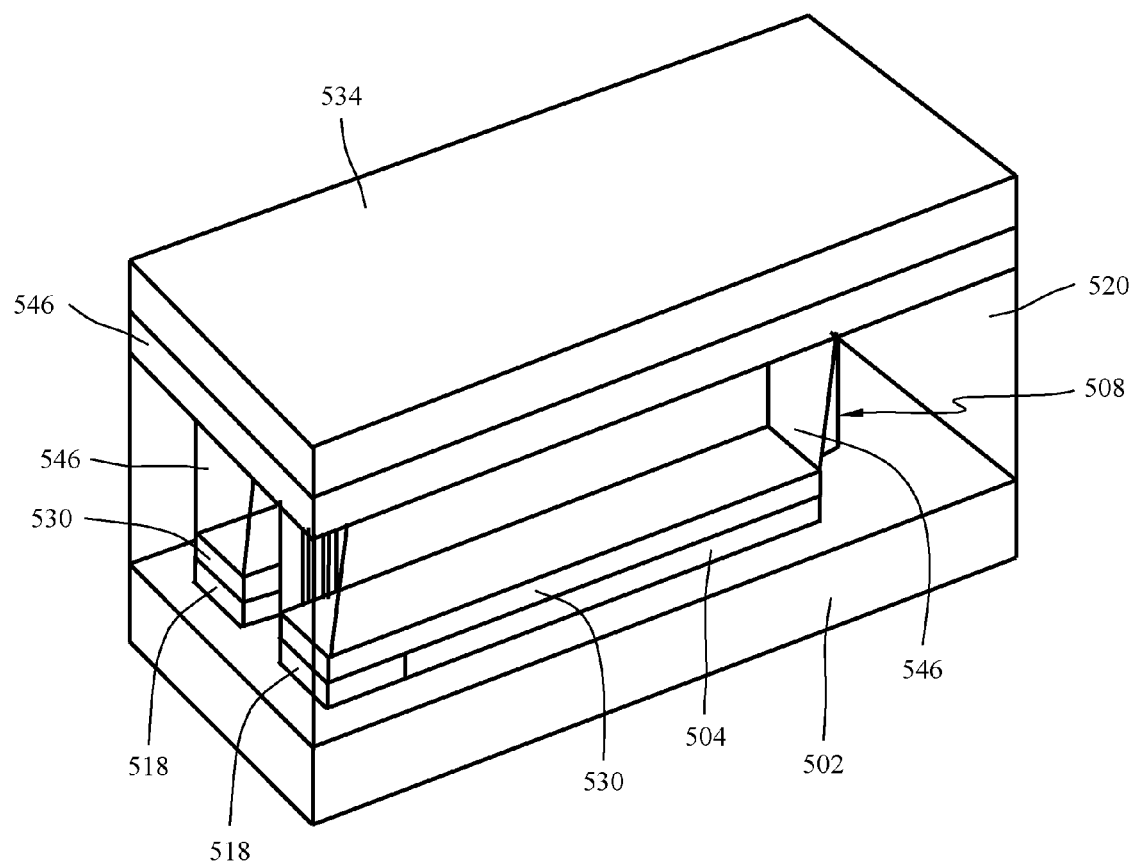
FIG. 35 depicts an isometric view of the structure of FIG. 34, with a transparent oxide layer, after applying a photo resist layer, in accordance with one or more aspects of the present invention.
Figure 36:
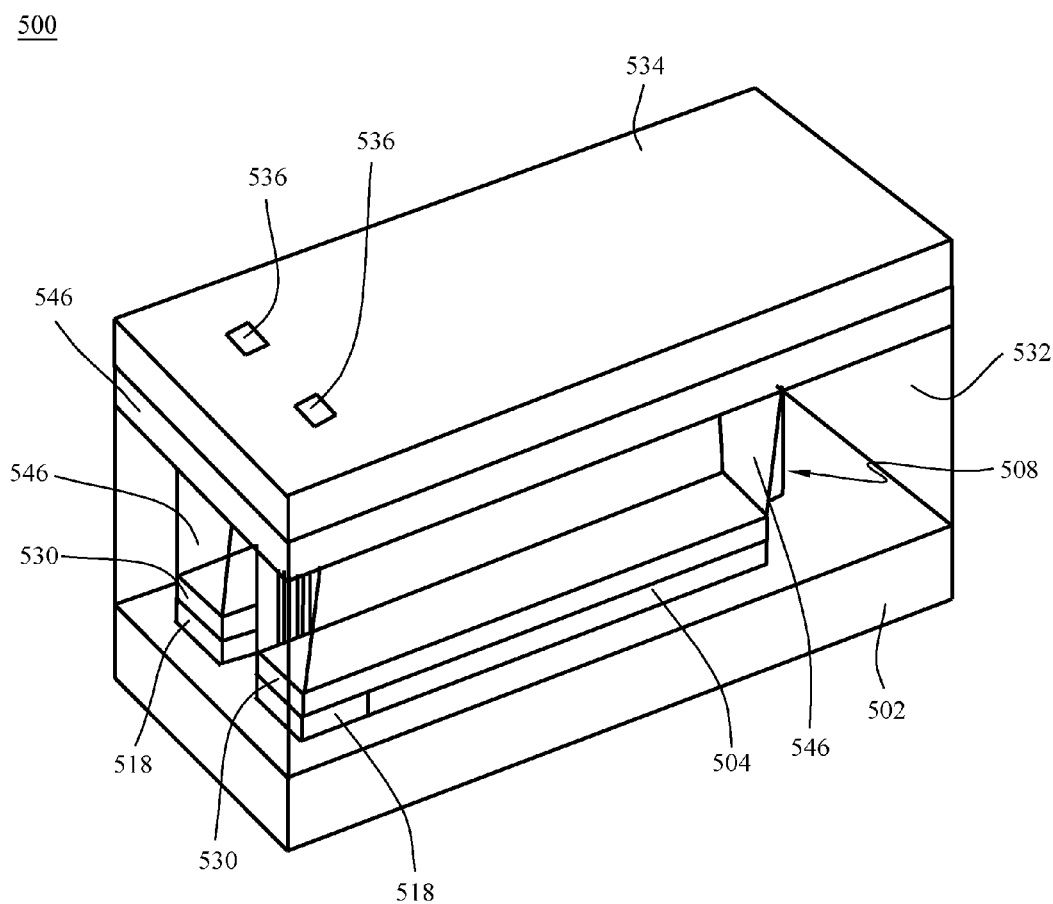
FIG. 36 depicts the structure of FIG. 35 after patterning the photo resist layer, in accordance with one or more aspects of the present invention.
Figure 37:
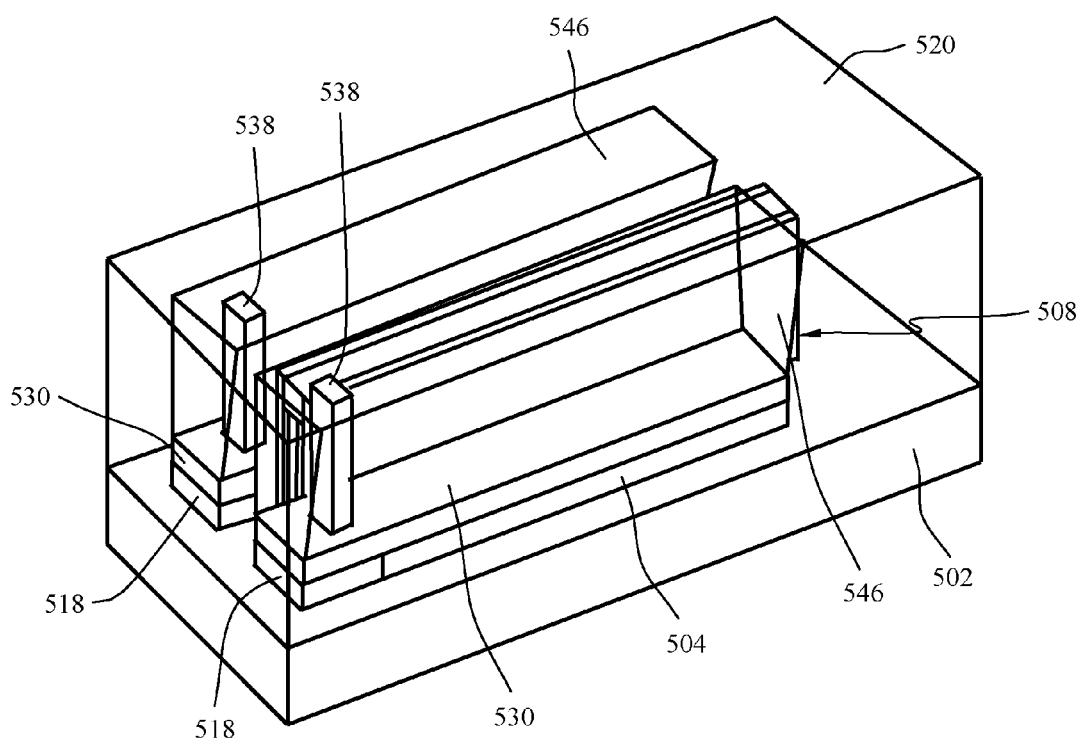
FIG. 37 depicts the structure of FIG. 36, with a transparent oxide layer and low k material, after etching to form the small contact openings and removing the photo resist layer, in accordance with one or more aspects of the present invention.
Figure 38:
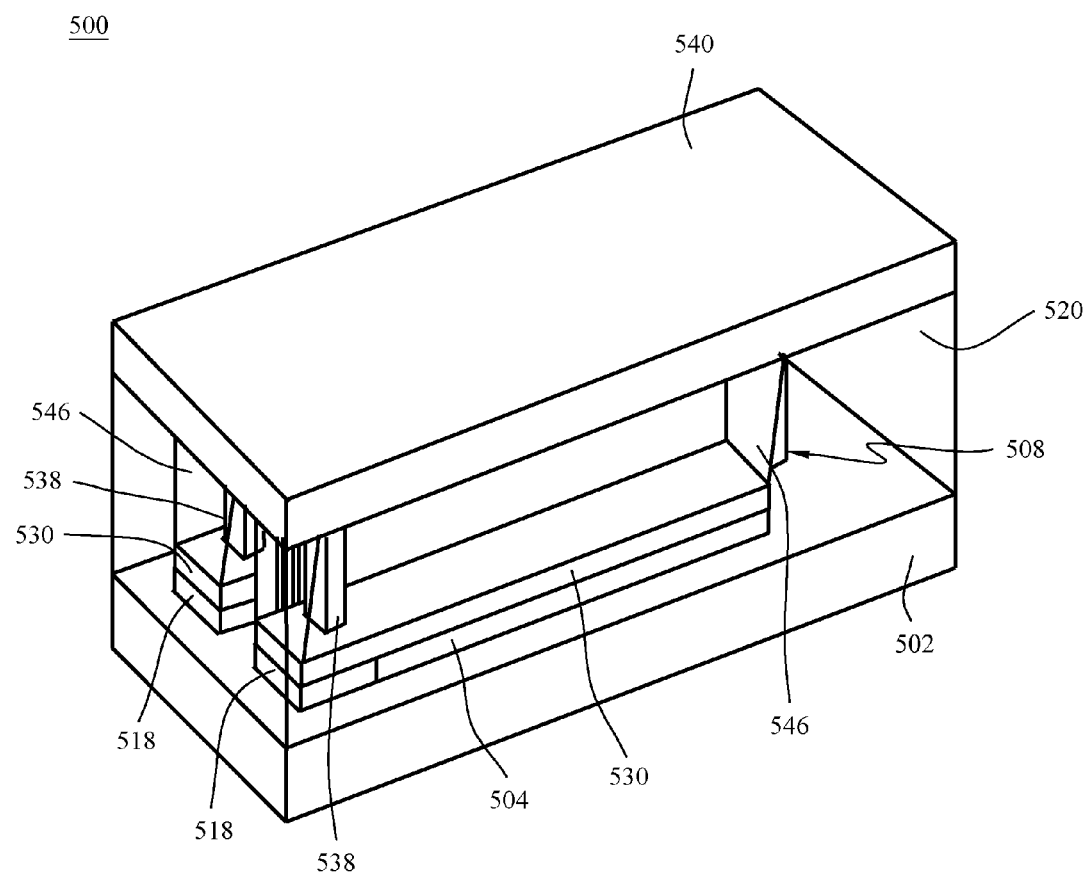
FIG. 38 depicts the structure of FIG. 37 after depositing a first metal layer for the small contacts, in accordance with one or more aspects of the present invention.
Figure 39:
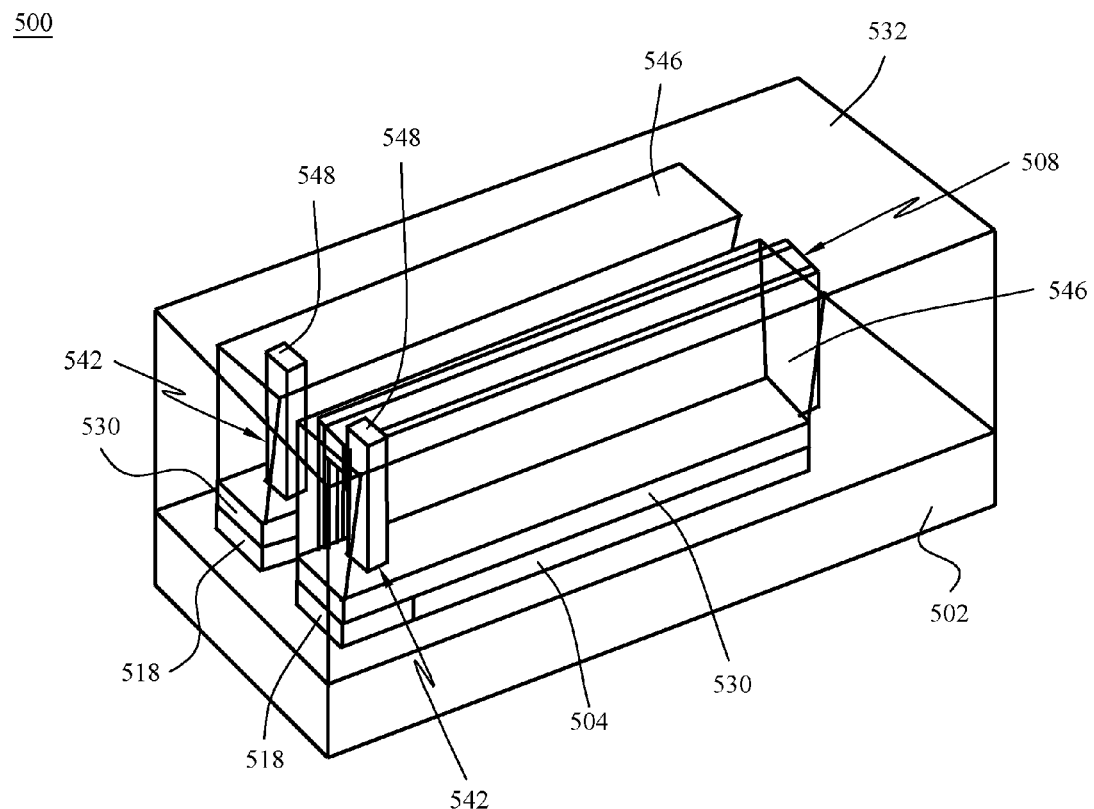
FIG. 39 depicts the structure of FIG. 38 after performing planarization of the device, in accordance with one or more aspects of the present invention.

As described in greater detail above, the device 500 may then be processed through the steps shown in FIGS. 2-10. The device 200 of FIGS. 9 and 10, may then receive a deposition of low k material 546 forming an intermediate semiconductor device 500, as shown in FIG. 33. The low k material may be, for example, SiCOH. The device 500 may then be planarized to remove the excess low k material 546, as shown in FIG. 34. Next, as shown in FIG. 35, a second photo resist layer 534 may be applied over the device 500. As illustrated in FIG. 36, the photo resist layer 534 may then be patterned to form openings 536 in the photo resist layer 534. The device 500 may then be etched to form small contact openings or cavities 538 in the low k material 546 and the photo resist layer 534 removed, as shown in FIG. 37. Next, as shown in FIG. 38, a second metal layer 540 may be deposited over the device 500 filling the openings 538. The device 500 may then be planarized by, for example, chemical mechanical planarization, to remove the excess second metal layer 540 to form a first portion 548 of the contacts 542, as shown in FIG. 39.

Figure 40:
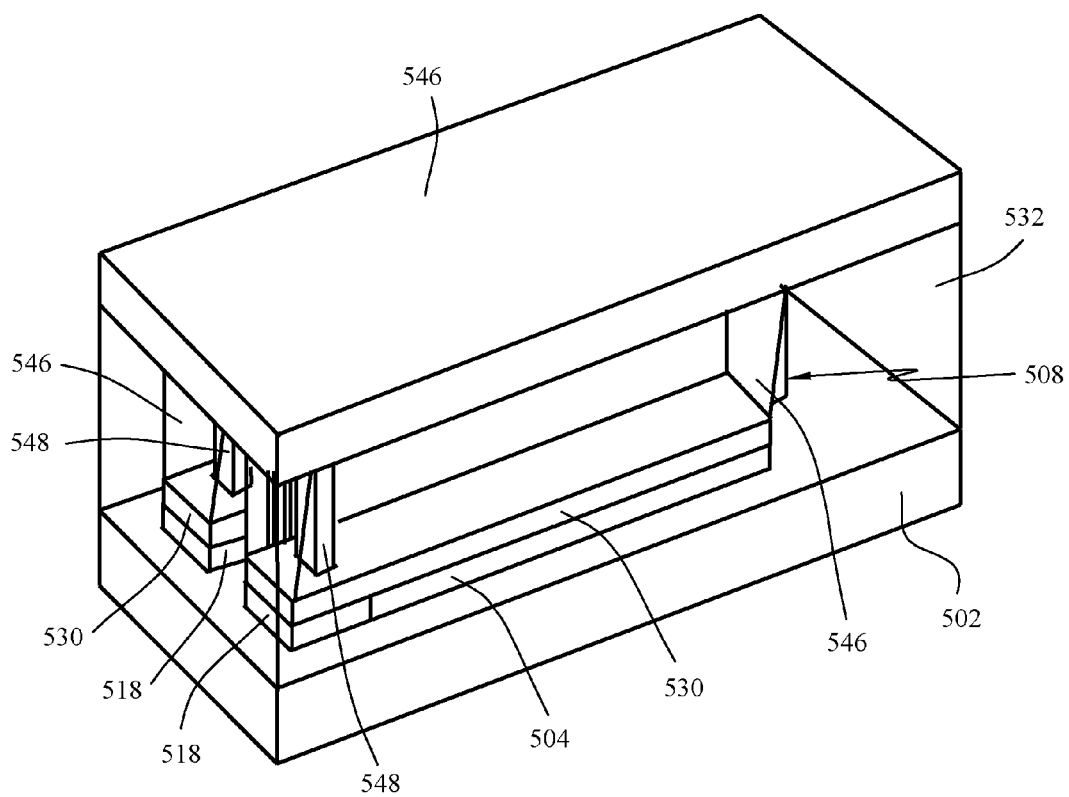
FIG. 40 depicts the structure of FIG. 39 after depositing additional low k material, in accordance with one or more aspects of the present invention.
Figure 41:
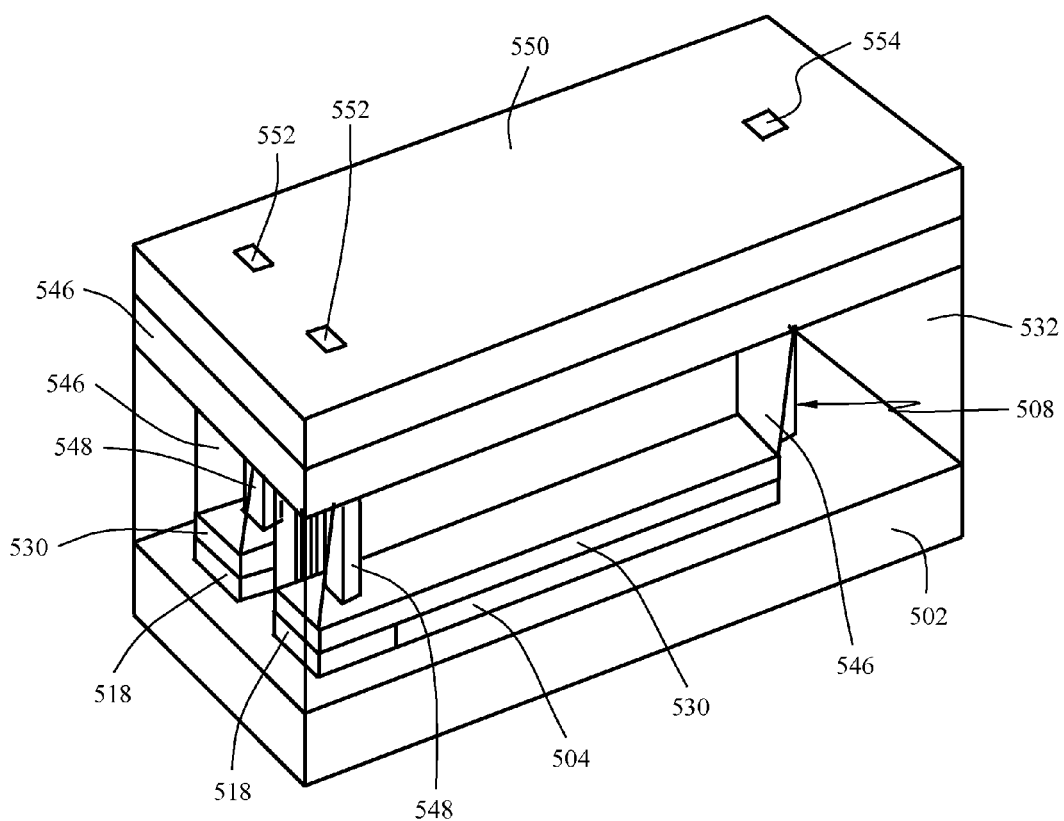
FIG. 41 depicts the structure of FIG. 40 after applying and patterning a second photo resist layer, in accordance with one or more aspects of the present invention.
Figure 42:
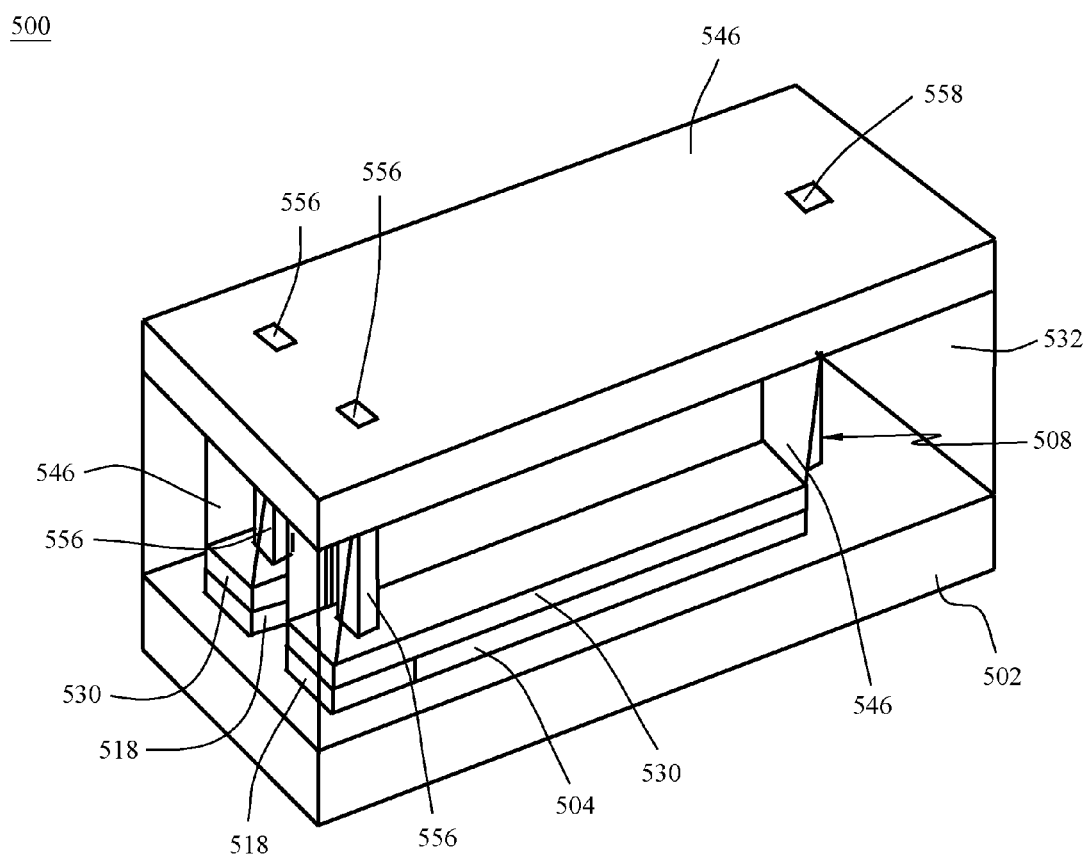
FIG. 42 depicts the structure of FIG. 41 after etching to form the second part of the small contact openings and gate contact openings and removing the photo resist layer, in accordance with one or more aspects of the present invention.
Figure 43:
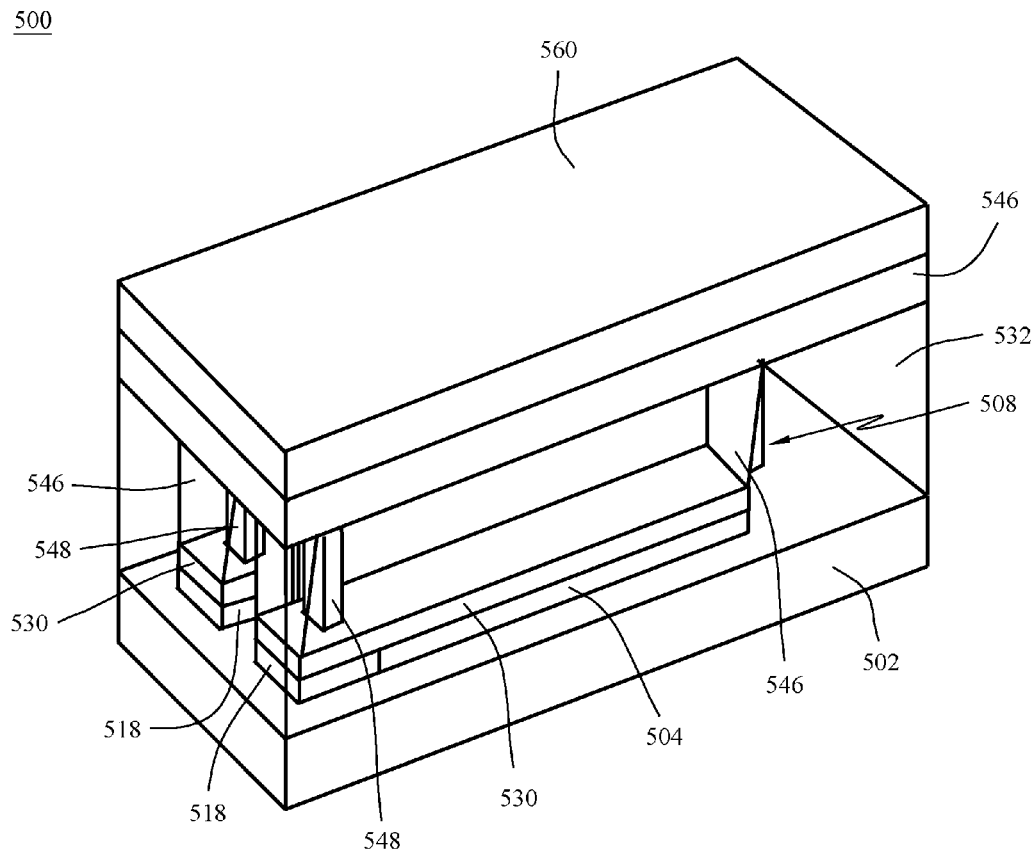
FIG. 43 depicts the structure of FIG. 42 after depositing second metal layer to form the contacts, in accordance with one or more aspects of the present invention.
Figure 44:
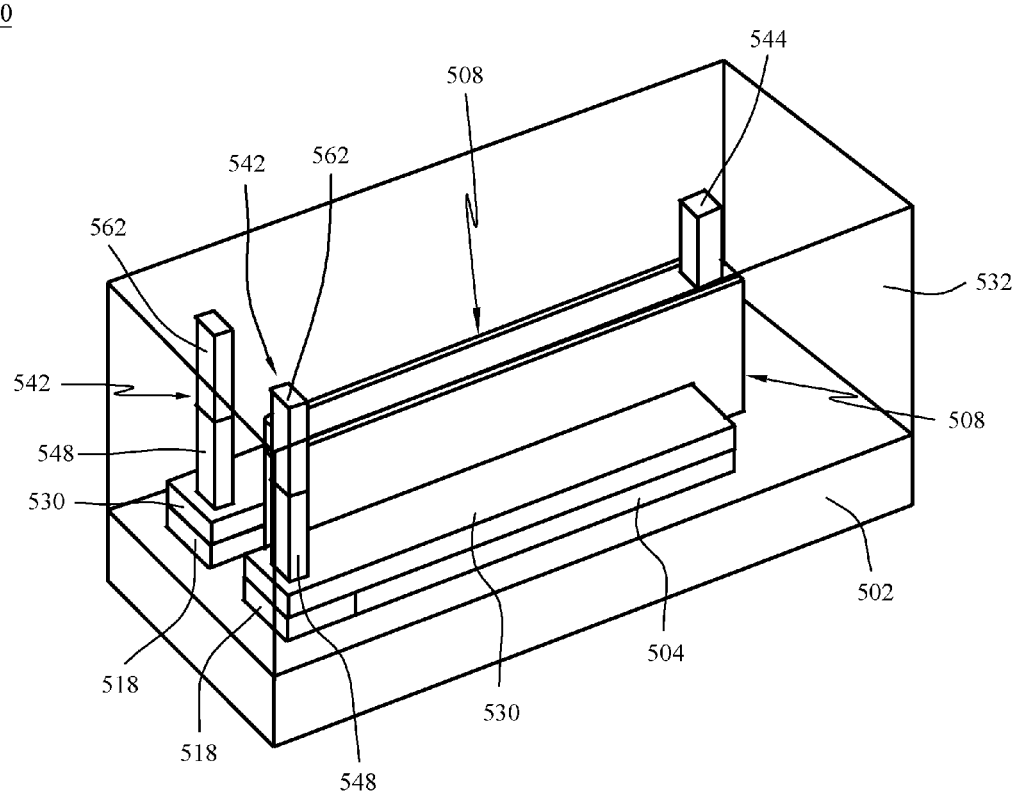
FIG. 44 depicts the structure of FIG. 43 after performing planarization to remove the excess second metal, in accordance with one or more aspects of the present invention.

Next, as shown in FIG. 40, additional low k material 546 may be deposited over the device 500. Then, a third photo resist layer 550 may be applied over the additional low k material 546 of the device 500 and patterned to form small contact openings 552 and at least one gate opening 554 in the photo resist layer 550, as shown in FIG. 41. The device 500 may be etched to form small contact openings or cavities 556 and at least one gate contact opening or cavity 558 and the third photo resist layer 550 removed, as shown in FIG. 42. A third metal layer 560 may then be deposited over the device 500 filling the openings 556 and 558, as shown in FIG. 43. The device may then be planarized by, for example, chemical mechanical planarization, to remove the excess third metal layer 560 to form a second portion 562 of the contacts 542 and the gate contacts 544, as shown in FIG. 44. The first portion 548 and a second portion 562 of the contacts 542 may be made of, for example, the same metal or different metals. Next, the device 500 may be passed for further processing, for example, back end of line processing.

The contacts 542 may be sized and offset from the gate 508 to reduce gate to contact capacitance and gate to contact short failure. Although only one small contact 542 is shown, it is also contemplated that there may be multiple small contacts 542 over each source 504 and drain 506 or the regions 518 adjacent to each source 504 and drain 506. As shown, the small contacts 542 may have a width smaller than the width of the contact regions 530 and a height, for example, greater than the height of the at least one gate 508. The total height of the small contacts 242 may range from, for example, approximately 70 nm to 250 nm and, more specifically, approximately 90 nm to 160 nm. Thus, by way of specific example, the first portion 548 of the small contacts 542 may have height of, for example, approximately 35 nm to 125 nm and, more specifically, approximately 45 nm to 80 nm, and the second portion 562 of the small contacts 542 may have a height of, for example, approximately 35 nm to 125 nm and, more specifically, approximately 45 nm to 80 nm. Optionally, the gate contacts 544 may be formed after the formation of the contacts 542, by completing another contact formation process as discussed above to form the gate contact 544 over the gate 508. The gate contacts 544 may have a height of, for example, approximately 30 nm to 150 nm and, more specifically, approximately 40 nm to 80 nm.

As may be recognized by those of ordinary skill in the art based on the teachings herein, numerous changes and modifications may be made to the above-described and other embodiments of the present invention without departing from the scope of the invention. For example, the small contacts may be positioned offset from or next to the gate, the small contacts may vary in size, and the small contacts may be made of one or more metals, and other components of the device and/or method as disclosed in the specification, including the accompanying abstract and drawings, may be replaced by alternative component(s) or features(s), such as those disclosed in another embodiment, which serve the same, equivalent or similar purpose as known by those skilled in the art to achieve the same, equivalent or similar results by such alternative component(s) or feature(s) to provide a similar function for the intended purpose. In addition, the devices and systems may include more or fewer components or features than the embodiments as described and illustrated herein. For example, the components and features of FIGS. 2-18, FIGS. 19-23, FIGS. 24-31, and FIGS. 32-43 may all be used interchangeably and in alternative combinations as would be modified or altered by one of skill in the art. Accordingly, this detailed description of the currently-preferred embodiments is to be taken in an illustrative, as opposed to limiting of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining a wafer with at least one source, at least one drain, and at least one gate;
    forming a first contact region over at least a portion of the at least one source and at least a portion of an isolation region adjacent to the at least one source;
    forming a second contact region over at least a portion of the at least one drain and at least a portion of an isolation region adjacent to the at least one drain;
    forming at least one first small contact over the first contact region, wherein the at least one first small contact is positioned on the first contact region over the isolation region and offset from the at least one source; and
    forming at least one second small contact over the second contact region wherein the at least one second small contact is positioned on the second contact region over the isolation region and offset from the at least one drain.

2. The method of claim 1, wherein the wafer is obtained after replacement metal gate and SAC cap formation.

3. The method of claim 1, wherein the position of the at least one first small contact and the at least one second small contact is selected from at least one of offset from the at least one gate and adjacent to the at least one gate.

4. The method of claim 1, wherein forming at least one first and second small contacts, comprises:
    forming a first portion of the at least one first and second small contacts; and
    forming a second portion of the at least one first and second small contacts over the first portion.

5. The method of claim 4, wherein the first portion comprises a first metal and the second portion comprises a second metal.

6. The method of claim 1, wherein forming the first contact region over the at least one source and the second contact region over the at least one drain comprises:
    depositing a first oxide layer over the wafer;
    applying and patterning a first photo resist layer;
    etching the first oxide layer to form at least one cavity down to the at least one source and the at least one drain;
    removing the first photo resist layer;
    depositing a first metal layer into the at least one cavity;
    performing planarization to the wafer to remove the first metal layer above the at least one cavity; and
    etching to partially recess the remaining metal layer to form the first contact region and the second contact region.

7. The method of claim 1, wherein forming the at least one first small contact over the first contact region and the at least one second small contact over the second contact region comprises:
depositing a second oxide layer over the wafer;
applying and patterning a second photo resist layer for formation of the at least one first small contact and the at least one second small contact;
etching the second oxide layer to form a first small contact opening and a second small contact opening;
removing the second photo resist layer;
depositing a second metal layer over the wafer; and
performing planarization to the wafer to remove the second metal layer down to the second oxide layer to form a first small contact and a second small contact.

8. The method of claim 7, wherein the first small contact and the second small contact are positioned offset from the at least one gate and have a height greater than a height of the at least one gate.

9. The method of claim 7, wherein the first small contact and the second small contact are positioned next to the at least one gate and have a height greater than a height of the at least one gate.

10. The method of claim 7, further comprising:
applying and patterning a third photo resist layer over the wafer;
etching the second metal layer to remove a portion of the second metal layer not covered by the third photo resist layer; and
removing the third photo resist layer.

11. The method of claim 10, further comprising:
performing reactive ion etching to form at least one gate contact.

12. The method of claim 1, wherein forming the at least one first small contact over the first contact region and at least one second small contact over the second contact region comprises:
depositing a low k layer over the wafer;
applying and patterning a second photo resist layer for formation of the at least one first small contact and the at least one second small contact;
etching the low k layer to form a first small contact opening and a second small contact opening;
removing the second photo resist layer;
depositing a second metal layer over the wafer; and
performing planarization to the wafer to remove the second metal layer down to the low k layer to form a first small contact and a second small contact.

13. The method of claim 12, further comprising:
depositing a second low k layer over the wafer;
applying and patterning a third photo resist layer for formation of a second portion of the at least one first small contact and a second portion of the at least one second small contact;
etching the second low k layer down to the first small contact and the second small contact;
depositing a third metal layer over the wafer;
performing planarization on the wafer to remove the third metal layer down to the second low k layer to form a second portion of the first small contact and the second small contact.

14. The method of claim 1, wherein the at least one first small contact has a width equal to the width of the at least one source and the at least one second small contact has a width equal to the width of the at least one drain.

15. An intermediate semiconductor device comprising:
a wafer with at least one gate, at least one source region, and at least one drain region;
at least one first contact region positioned over at least a portion of the at least one source region and at least a portion of an isolation region adjacent to the at least one source;
at least one second contact region positioned over at least a portion of the at least one drain region and at least a portion of an isolation region adjacent to the at least one drain;
at least one first small contact positioned above the at least one first contact region over the isolation region adjacent to the at least one source and offset from the at least one source; and
at least one second small contact positioned above the at least one second contact region over the isolation region adjacent to the at least one drain and offset from the at least one drain.

16. The device of claim 15, wherein the position of the at least one first small contact and the at least one second small contact is selected from at least one of offset from the at least one gate and adjacent to the at least one gate.

17. The device of claim 15, wherein the at least one first small contact and the at least one second small contact comprise:
a first portion; and
a second portion positioned over the first portion.

18. The device of claim 17, wherein the first portion is a first metal and the second portion is a second metal.

19. The device of claim 15, wherein the at least one first and second small contacts have a height ranging from 70 nm to 250 nm and the at least one gate has a height ranging from 30 nm to 150 nm.

20. The intermediate semiconductor device of claim 15, wherein the at least one first small contact has a width equal to the width of the at least one source and the at least one second small contact has a width equal to the width of the at least one drain.

* * * * *